United States Patent
Kohtz et al.

(10) Patent No.: US 10,732,226 B2
(45) Date of Patent: Aug. 4, 2020

(54) METHODS FOR ESTIMATING A NUMBER OF WORKFLOW CYCLES ABLE TO BE COMPLETED FROM A REMAINING BATTERY CAPACITY

(71) Applicant: Hand Held Products, Inc., Fort Mill, SC (US)

(72) Inventors: Robert Arlan Kohtz, Cedar Rapids, IA (US); Rickey George Austin, Lisbon, IA (US)

(73) Assignee: HAND HELD PRODUCTS, INC., Fort Mill, SC (US)

( * ) Notice: Subject to any disclaimer, the term of this patent is extended or adjusted under 35 U.S.C. 154(b) by 431 days.

(21) Appl. No.: 15/606,529

(22) Filed: May 26, 2017

(65) Prior Publication Data

US 2018/0340982 A1  Nov. 29, 2018

(51) Int. Cl.
| | |
|---|---|
| *G01R 31/36* | (2020.01) |
| *G01R 31/387* | (2019.01) |
| *G06F 11/30* | (2006.01) |
| *G06Q 10/04* | (2012.01) |

(Continued)

(52) U.S. Cl.
CPC ....... *G01R 31/387* (2019.01); *G01R 31/3646* (2019.01); *G01R 31/3648* (2013.01); *G06F 11/3058* (2013.01); *G06F 11/3062* (2013.01); *G06F 11/3089* (2013.01); *G06Q 10/04* (2013.01); *H01M 10/48* (2013.01);

(Continued)

(58) Field of Classification Search
None
See application file for complete search history.

(56) References Cited

U.S. PATENT DOCUMENTS

| | | |
|---|---|---|
| 5,606,243 A | 2/1997 | Sakai et al. |
| 6,832,725 B2 | 12/2004 | Gardiner et al. |
| 6,915,221 B2 | 7/2005 | Pehrsson et al. |

(Continued)

FOREIGN PATENT DOCUMENTS

| | | |
|---|---|---|
| WO | 2013163789 A1 | 11/2013 |
| WO | 2013173985 A1 | 11/2013 |

(Continued)

OTHER PUBLICATIONS

Zengkai Wang in Remaining capacity estimation of lithium-ion batteries based on the constant voltage charging profile, 22 pages, Jul. 6, 2018 (Year: 2018).*

(Continued)

*Primary Examiner* — Tung S Lau
(74) *Attorney, Agent, or Firm* — Alston & Bird LLP

(57) ABSTRACT

Methods are provided for generating an estimated number of workflow cycles able to be executed with a remaining battery capacity of a battery in a device. A workflow cycle comprising a predefined series of tasks of a work application executed during a defined timeframe is defined. Beginning battery capacity is determined at start of work application execution. End battery capacity at completion of work application execution is determined. Battery usage estimate associated with work application is calculated from difference between beginning battery capacity and end battery capacity. The estimated number of workflow cycles able to be executed is based on the remaining battery capacity and the battery usage estimate.

20 Claims, 3 Drawing Sheets

(51) Int. Cl.
   *H01M 10/48* (2006.01)
   *H04R 1/10* (2006.01)
(52) U.S. Cl.
   CPC ....... *H04R 1/1025* (2013.01); *H01M 2220/30* (2013.01); *H04R 2460/03* (2013.01)

(56) References Cited

U.S. PATENT DOCUMENTS

| | | |
|---|---|---|
| 7,128,266 B2 | 10/2006 | Zhu et al. |
| 7,159,783 B2 | 1/2007 | Walczyk et al. |
| 7,413,127 B2 | 8/2008 | Ehrhart et al. |
| 7,726,575 B2 | 6/2010 | Wang et al. |
| 8,294,969 B2 | 10/2012 | Plesko |
| 8,317,105 B2 | 11/2012 | Kotlarsky et al. |
| 8,322,622 B2 | 12/2012 | Liu |
| 8,366,005 B2 | 2/2013 | Kotlarsky et al. |
| 8,371,507 B2 | 2/2013 | Haggerty et al. |
| 8,376,233 B2 | 2/2013 | Van Horn et al. |
| 8,381,979 B2 | 2/2013 | Franz |
| 8,390,909 B2 | 3/2013 | Plesko |
| 8,408,464 B2 | 4/2013 | Zhu et al. |
| 8,408,468 B2 | 4/2013 | Horn et al. |
| 8,408,469 B2 | 4/2013 | Good |
| 8,424,768 B2 | 4/2013 | Rueblinger et al. |
| 8,448,863 B2 | 5/2013 | Xian et al. |
| 8,457,013 B2 | 6/2013 | Essinger et al. |
| 8,459,557 B2 | 6/2013 | Havens et al. |
| 8,469,272 B2 | 6/2013 | Kearney |
| 8,474,712 B2 | 7/2013 | Kearney et al. |
| 8,479,992 B2 | 7/2013 | Kotlarsky et al. |
| 8,490,877 B2 | 7/2013 | Kearney |
| 8,517,271 B2 | 8/2013 | Kotlarsky et al. |
| 8,523,076 B2 | 9/2013 | Good |
| 8,528,818 B2 | 9/2013 | Ehrhart et al. |
| 8,544,737 B2 | 10/2013 | Gomez et al. |
| 8,548,420 B2 | 10/2013 | Grunow et al. |
| 8,550,335 B2 | 10/2013 | Samek et al. |
| 8,550,354 B2 | 10/2013 | Gannon et al. |
| 8,550,357 B2 | 10/2013 | Kearney |
| 8,556,174 B2 | 10/2013 | Kosecki et al. |
| 8,556,176 B2 | 10/2013 | Van Horn et al. |
| 8,556,177 B2 | 10/2013 | Hussey et al. |
| 8,559,767 B2 | 10/2013 | Barber et al. |
| 8,561,895 B2 | 10/2013 | Gomez et al. |
| 8,561,903 B2 | 10/2013 | Sauerwein |
| 8,561,905 B2 | 10/2013 | Edmonds et al. |
| 8,565,107 B2 | 10/2013 | Pease et al. |
| 8,571,307 B2 | 10/2013 | Li et al. |
| 8,579,200 B2 | 11/2013 | Samek et al. |
| 8,583,924 B2 | 11/2013 | Caballero et al. |
| 8,584,945 B2 | 11/2013 | Wang et al. |
| 8,587,595 B2 | 11/2013 | Wang |
| 8,587,697 B2 | 11/2013 | Hussey et al. |
| 8,588,869 B2 | 11/2013 | Sauerwein et al. |
| 8,590,789 B2 | 11/2013 | Nahill et al. |
| 8,596,539 B2 | 12/2013 | Havens et al. |
| 8,596,542 B2 | 12/2013 | Havens et al. |
| 8,596,543 B2 | 12/2013 | Havens et al. |
| 8,599,271 B2 | 12/2013 | Havens et al. |
| 8,599,957 B2 | 12/2013 | Peake et al. |
| 8,600,158 B2 | 12/2013 | Li et al. |
| 8,600,167 B2 | 12/2013 | Showering |
| 8,602,309 B2 | 12/2013 | Longacre et al. |
| 8,608,053 B2 | 12/2013 | Meier et al. |
| 8,608,071 B2 | 12/2013 | Liu et al. |
| 8,611,309 B2 | 12/2013 | Wang et al. |
| 8,615,487 B2 | 12/2013 | Gomez et al. |
| 8,621,123 B2 | 12/2013 | Caballero |
| 8,622,303 B2 | 1/2014 | Meier et al. |
| 8,628,013 B2 | 1/2014 | Ding |
| 8,628,015 B2 | 1/2014 | Wang et al. |
| 8,628,016 B2 | 1/2014 | Winegar |
| 8,629,926 B2 | 1/2014 | Wang |
| 8,630,491 B2 | 1/2014 | Longacre et al. |
| 8,635,309 B2 | 1/2014 | Berthiaume et al. |
| 8,636,200 B2 | 1/2014 | Kearney |
| 8,636,212 B2 | 1/2014 | Nahill et al. |
| 8,636,215 B2 | 1/2014 | Ding et al. |
| 8,636,224 B2 | 1/2014 | Wang |
| 8,638,806 B2 | 1/2014 | Wang et al. |
| 8,640,958 B2 | 2/2014 | Lu et al. |
| 8,640,960 B2 | 2/2014 | Wang et al. |
| 8,643,717 B2 | 2/2014 | Li et al. |
| 8,646,692 B2 | 2/2014 | Meier et al. |
| 8,646,694 B2 | 2/2014 | Wang et al. |
| 8,657,200 B2 | 2/2014 | Ren et al. |
| 8,659,397 B2 | 2/2014 | Vargo et al. |
| 8,668,149 B2 | 3/2014 | Good |
| 8,678,285 B2 | 3/2014 | Kearney |
| 8,678,286 B2 | 3/2014 | Smith et al. |
| 8,682,077 B1 | 3/2014 | Longacre |
| D702,237 S | 4/2014 | Oberpriller et al. |
| 8,687,282 B2 | 4/2014 | Feng et al. |
| 8,692,927 B2 | 4/2014 | Pease et al. |
| 8,695,880 B2 | 4/2014 | Bremer et al. |
| 8,698,949 B2 | 4/2014 | Grunow et al. |
| 8,702,000 B2 | 4/2014 | Barber et al. |
| 8,717,494 B2 | 5/2014 | Gannon |
| 8,720,783 B2 | 5/2014 | Biss et al. |
| 8,723,804 B2 | 5/2014 | Fletcher et al. |
| 8,723,904 B2 | 5/2014 | Marty et al. |
| 8,727,223 B2 | 5/2014 | Wang |
| 8,740,082 B2 | 6/2014 | Wilz |
| 8,740,085 B2 | 6/2014 | Furlong et al. |
| 8,746,563 B2 | 6/2014 | Hennick et al. |
| 8,750,445 B2 | 6/2014 | Peake et al. |
| 8,752,766 B2 | 6/2014 | Xian et al. |
| 8,756,059 B2 | 6/2014 | Braho et al. |
| 8,757,495 B2 | 6/2014 | Qu et al. |
| 8,760,563 B2 | 6/2014 | Koziol et al. |
| 8,763,909 B2 | 7/2014 | Reed et al. |
| 8,777,108 B2 | 7/2014 | Coyle |
| 8,777,109 B2 | 7/2014 | Oberpriller et al. |
| 8,779,898 B2 | 7/2014 | Havens et al. |
| 8,781,520 B2 | 7/2014 | Payne et al. |
| 8,783,573 B2 | 7/2014 | Havens et al. |
| 8,789,757 B2 | 7/2014 | Barten |
| 8,789,758 B2 | 7/2014 | Hawley et al. |
| 8,789,759 B2 | 7/2014 | Xian et al. |
| 8,794,520 B2 | 8/2014 | Wang et al. |
| 8,794,522 B2 | 8/2014 | Ehrhart |
| 8,794,525 B2 | 8/2014 | Amundsen et al. |
| 8,794,526 B2 | 8/2014 | Wang et al. |
| 8,798,367 B2 | 8/2014 | Ellis |
| 8,807,431 B2 | 8/2014 | Wang et al. |
| 8,807,432 B2 | 8/2014 | Van Horn et al. |
| 8,820,630 B2 | 9/2014 | Qu et al. |
| 8,822,848 B2 | 9/2014 | Meagher |
| 8,824,692 B2 | 9/2014 | Sheerin et al. |
| 8,824,696 B2 | 9/2014 | Braho |
| 8,842,849 B2 | 9/2014 | Wahl et al. |
| 8,844,822 B2 | 9/2014 | Kotlarsky et al. |
| 8,844,823 B2 | 9/2014 | Fritz et al. |
| 8,849,019 B2 | 9/2014 | Li et al. |
| D716,285 S | 10/2014 | Chaney et al. |
| 8,851,383 B2 | 10/2014 | Yeakley et al. |
| 8,854,633 B2 | 10/2014 | Laffargue |
| 8,866,963 B2 | 10/2014 | Grunow et al. |
| 8,868,421 B2 | 10/2014 | Braho et al. |
| 8,868,519 B2 | 10/2014 | Maloy et al. |
| 8,868,802 B2 | 10/2014 | Barten |
| 8,868,803 B2 | 10/2014 | Caballero |
| 8,870,074 B1 | 10/2014 | Gannon |
| 8,879,639 B2 | 11/2014 | Sauerwein |
| 8,880,426 B2 | 11/2014 | Smith |
| 8,881,983 B2 | 11/2014 | Havens et al. |
| 8,881,987 B2 | 11/2014 | Wang |
| 8,903,172 B2 | 12/2014 | Smith |
| 8,908,995 B2 | 12/2014 | Benos et al. |
| 8,910,870 B2 | 12/2014 | Li et al. |
| 8,910,875 B2 | 12/2014 | Ren et al. |
| 8,914,290 B2 | 12/2014 | Hendrickson et al. |
| 8,914,788 B2 | 12/2014 | Pettinelli et al. |
| 8,915,439 B2 | 12/2014 | Feng et al. |

(56) References Cited

U.S. PATENT DOCUMENTS

| | | |
|---|---|---|
| 8,915,444 B2 | 12/2014 | Havens et al. |
| 8,916,789 B2 | 12/2014 | Woodburn |
| 8,918,250 B2 | 12/2014 | Hollifield |
| 8,918,564 B2 | 12/2014 | Caballero |
| 8,925,818 B2 | 1/2015 | Kosecki et al. |
| 8,939,374 B2 | 1/2015 | Jovanovski et al. |
| 8,942,480 B2 | 1/2015 | Ellis |
| 8,944,313 B2 | 2/2015 | Williams et al. |
| 8,944,327 B2 | 2/2015 | Meier et al. |
| 8,944,332 B2 | 2/2015 | Harding et al. |
| 8,950,678 B2 | 2/2015 | Germaine et al. |
| D723,560 S | 3/2015 | Zhou et al. |
| 8,967,468 B2 | 3/2015 | Gomez et al. |
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 9,143,178 B1 | 9/2015 | Arscott et al. |
| 9,224,022 B2 | 12/2015 | Ackley et al. |
| 9,224,027 B2 | 12/2015 | Van Horn et al. |
| D747,321 S | 1/2016 | London et al. |
| 9,230,140 B1 | 1/2016 | Ackley |
| 9,443,123 B2 | 1/2016 | Hejl |
| 9,250,712 B1 | 2/2016 | Todeschini |
| 9,258,033 B2 | 2/2016 | Showering |
| 9,261,398 B2 | 2/2016 | Amundsen et al. |
| 9,262,633 B1 | 2/2016 | Todeschini et al. |
| 9,262,664 B2 | 2/2016 | Soule et al. |
| 9,274,806 B2 | 3/2016 | Barten |
| 9,282,501 B2 | 3/2016 | Wang et al. |
| 9,292,969 B2 | 3/2016 | Laffargue et al. |
| 9,298,667 B2 | 3/2016 | Caballero |
| 9,310,609 B2 | 4/2016 | Rueblinger et al. |
| 9,319,548 B2 | 4/2016 | Showering et al. |
| D757,009 S | 5/2016 | Oberpriller et al. |
| 9,342,724 B2 | 5/2016 | McCloskey |
| 9,342,827 B2 | 5/2016 | Smith |
| 9,355,294 B2 | 5/2016 | Smith et al. |
| 9,367,722 B2 | 6/2016 | Xian et al. |
| 9,375,945 B1 | 6/2016 | Bowles |
| D760,719 S | 7/2016 | Zhou et al. |
| 9,390,596 B1 | 7/2016 | Todeschini |
| 9,396,375 B2 | 7/2016 | Qu et al. |
| 9,398,008 B2 | 7/2016 | Todeschini et al. |
| D762,604 S | 8/2016 | Fitch et al. |
| D762,647 S | 8/2016 | Fitch et al. |
| 9,407,840 B2 | 8/2016 | Wang |
| 9,412,242 B2 | 8/2016 | Van Horn et al. |
| 9,418,252 B2 | 8/2016 | Nahill et al. |
| D766,244 S | 9/2016 | Zhou et al. |
| 9,443,222 B2 | 9/2016 | Singel et al. |
| 9,448,610 B2 | 9/2016 | Davis et al. |
| 9,478,113 B2 | 10/2016 | Xie et al. |
| 9,582,696 B2 | 2/2017 | Barber et al. |
| 9,616,749 B2 | 4/2017 | Chamberlin |
| 9,618,993 B2 | 4/2017 | Murawski et al. |
| 9,715,614 B2 | 7/2017 | Todeschini et al. |
| 9,734,493 B2 | 8/2017 | Gomez et al. |
| 10,019,334 B2 | 7/2018 | Caballero et al. |
| 10,021,043 B2 | 7/2018 | Sevier |
| 10,327,158 B2 | 6/2019 | Wang et al. |
| 10,410,029 B2 | 9/2019 | Powilleit |
| 2007/0063048 A1 | 3/2007 | Havens et al. |
| 2009/0134221 A1 | 5/2009 | Zhu et al. |
| 2010/0104929 A1* | 4/2010 | Schafer .............. B60L 58/22 429/90 |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2010/0265880 A1 | 10/2010 | Rautiola et al. |
| 2011/0083578 A1* | 4/2011 | Sami .................. E01B 31/17 105/50 |
| 2011/0154078 A1 | 6/2011 | Nrusimhan et al. |
| 2011/0169999 A1 | 7/2011 | Grunow et al. |
| 2011/0202554 A1 | 8/2011 | Powilleit et al. |
| 2012/0111946 A1 | 5/2012 | Golant |
| 2012/0168512 A1 | 7/2012 | Kotlarsky et al. |
| 2012/0193423 A1 | 8/2012 | Samek |
| 2012/0203647 A1 | 8/2012 | Smith |
| 2012/0223141 A1 | 9/2012 | Good et al. |
| 2013/0043312 A1 | 2/2013 | Van Horn |
| 2013/0075168 A1 | 3/2013 | Amundsen et al. |
| 2013/0175341 A1 | 7/2013 | Kearney et al. |
| 2013/0175343 A1 | 7/2013 | Good |
| 2013/0175975 A1* | 7/2013 | Shinozaki .......... H01M 10/48 320/106 |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0287258 A1 | 10/2013 | Kearney |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308625 A1 | 11/2013 | Park et al. |
| 2013/0313324 A1 | 11/2013 | Koziol et al. |
| 2013/0313325 A1 | 11/2013 | Wilz et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |

(56) References Cited

U.S. PATENT DOCUMENTS

| | | |
|---|---|---|
| 2014/0025584 A1 | 1/2014 | Liu et al. |
| 2014/0100813 A1 | 1/2014 | Showering |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061306 A1 | 3/2014 | Wu et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0098792 A1 | 4/2014 | Wang et al. |
| 2014/0100774 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Giordano et al. |
| 2014/0104451 A1 | 4/2014 | Todeschini et al. |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131438 A1 | 5/2014 | Kearney |
| 2014/0131441 A1 | 5/2014 | Nahill et al. |
| 2014/0131443 A1 | 5/2014 | Smith |
| 2014/0131444 A1 | 5/2014 | Wang |
| 2014/0131445 A1 | 5/2014 | Ding et al. |
| 2014/0131448 A1 | 5/2014 | Xian et al. |
| 2014/0133379 A1 | 5/2014 | Wang et al. |
| 2014/0136208 A1 | 5/2014 | Maltseff et al. |
| 2014/0140585 A1 | 5/2014 | Wang |
| 2014/0151453 A1 | 6/2014 | Meier et al. |
| 2014/0152882 A1 | 6/2014 | Samek et al. |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0191644 A1 | 7/2014 | Chaney |
| 2014/0191913 A1 | 7/2014 | Ge et al. |
| 2014/0197238 A1 | 7/2014 | Lui et al. |
| 2014/0197239 A1 | 7/2014 | Havens et al. |
| 2014/0197304 A1 | 7/2014 | Feng et al. |
| 2014/0203087 A1 | 7/2014 | Smith et al. |
| 2014/0204268 A1 | 7/2014 | Grunow et al. |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0231500 A1 | 8/2014 | Ehrhart et al. |
| 2014/0232930 A1 | 8/2014 | Anderson |
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0267609 A1 | 9/2014 | Laffargue |
| 2014/0270196 A1 | 9/2014 | Braho et al. |
| 2014/0270229 A1 | 9/2014 | Braho |
| 2014/0278387 A1 | 9/2014 | DiGregorio |
| 2014/0278391 A1 | 9/2014 | Braho et al. |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0312121 A1 | 10/2014 | Lu et al. |
| 2014/0319220 A1 | 10/2014 | Coyle |
| 2014/0319221 A1 | 10/2014 | Oberpriller et al. |
| 2014/0326787 A1 | 11/2014 | Barten |
| 2014/0332590 A1 | 11/2014 | Wang et al. |
| 2014/0344943 A1 | 11/2014 | Todeschini et al. |
| 2014/0346233 A1 | 11/2014 | Liu et al. |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0039309 A1 | 2/2015 | Braho et al. |
| 2015/0040378 A1 | 2/2015 | Saber et al. |
| 2015/0048168 A1 | 2/2015 | Fritz et al. |
| 2015/0049347 A1 | 2/2015 | Laffargue et al. |
| 2015/0051992 A1 | 2/2015 | Smith |
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0062366 A1 | 3/2015 | Liu et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0071819 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0127791 A1 | 5/2015 | Kosecki et al. |
| 2015/0128116 A1 | 5/2015 | Chen et al. |
| 2015/0129659 A1 | 5/2015 | Feng et al. |
| 2015/0133047 A1 | 5/2015 | Smith et al. |
| 2015/0134470 A1 | 5/2015 | Hejl et al. |
| 2015/0136851 A1 | 5/2015 | Harding et al. |
| 2015/0136854 A1 | 5/2015 | Lu et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0144701 A1 | 5/2015 | Xian et al. |
| 2015/0149946 A1 | 5/2015 | Benos et al. |
| 2015/0161429 A1 | 6/2015 | Xian |
| 2015/0169925 A1 | 6/2015 | Chang et al. |
| 2015/0169929 A1 | 6/2015 | Williams et al. |
| 2015/0178523 A1 | 6/2015 | Gelay et al. |
| 2015/0178534 A1 | 6/2015 | Jovanovski et al. |
| 2015/0178535 A1 | 6/2015 | Bremer et al. |
| 2015/0178536 A1 | 6/2015 | Hennick et al. |
| 2015/0178537 A1 | 6/2015 | El et al. |
| 2015/0181093 A1 | 6/2015 | Zhu et al. |
| 2015/0181109 A1 | 6/2015 | Gillet et al. |

(56) References Cited

U.S. PATENT DOCUMENTS

| | | |
|---|---|---|
| 2015/0186703 A1 | 7/2015 | Chen et al. |
| 2015/0193644 A1 | 7/2015 | Keamey et al. |
| 2015/0193645 A1 | 7/2015 | Colavito et al. |
| 2015/0199957 A1 | 7/2015 | Funyak et al. |
| 2015/0204671 A1 | 7/2015 | Showering |
| 2015/0210199 A1 | 7/2015 | Payne |
| 2015/0220753 A1 | 8/2015 | Zhu et al. |
| 2015/0254485 A1 | 9/2015 | Feng et al. |
| 2015/0327012 A1 | 11/2015 | Bian et al. |
| 2016/0014251 A1 | 1/2016 | Hejl |
| 2016/0040982 A1 | 2/2016 | Li et al. |
| 2016/0042241 A1 | 2/2016 | Todeschini |
| 2016/0057230 A1 | 2/2016 | Todeschini et al. |
| 2016/0066278 A1 | 3/2016 | Zhao et al. |
| 2016/0109219 A1 | 4/2016 | Ackley et al. |
| 2016/0109220 A1 | 4/2016 | Laffargue |
| 2016/0109224 A1 | 4/2016 | Thuries et al. |
| 2016/0112631 A1 | 4/2016 | Ackley et al. |
| 2016/0112643 A1 | 4/2016 | Laffargue et al. |
| 2016/0124516 A1 | 5/2016 | Schoon et al. |
| 2016/0125217 A1 | 5/2016 | Todeschini |
| 2016/0125342 A1 | 5/2016 | Miller et al. |
| 2016/0133253 A1 | 5/2016 | Braho et al. |
| 2016/0171720 A1 | 6/2016 | Todeschini |
| 2016/0178479 A1 | 6/2016 | Goldsmith |
| 2016/0180678 A1 | 6/2016 | Ackley et al. |
| 2016/0189087 A1 | 6/2016 | Morton et al. |
| 2016/0125873 A1 | 7/2016 | Braho et al. |
| 2016/0227912 A1 | 8/2016 | Oberpriller et al. |
| 2016/0232891 A1 | 8/2016 | Pecorari |
| 2016/0292477 A1 | 10/2016 | Bidwell |
| 2016/0294779 A1 | 10/2016 | Yeakley et al. |
| 2016/0306769 A1* | 10/2016 | Kohtz .................... H04W 4/50 |
| 2016/0314276 A1 | 10/2016 | Sewell et al. |
| 2016/0314294 A1 | 10/2016 | Kubler et al. |
| 2017/0149255 A1* | 5/2017 | Garcia-Acosta ...... H02J 7/0021 |
| 2017/0229071 A1* | 8/2017 | McMahan .......... G06K 9/00221 |
| 2017/0264987 A1* | 9/2017 | Hong .................... H04R 1/1025 |
| 2017/0359459 A1* | 12/2017 | Howe ................. H04M 1/0264 |
| 2017/0359860 A1* | 12/2017 | Howe ................. H04M 1/0264 |

FOREIGN PATENT DOCUMENTS

| | | |
|---|---|---|
| WO | 2014019130 A1 | 2/2014 |
| WO | 2014110495 A1 | 7/2014 |

OTHER PUBLICATIONS

Extended Search Report in related European Application No. 18172770.2 dated Jul. 9, 2018, pp. 1-8.
U.S. Appl. No. 14/715,916 for Evaluating Image Values filed May 19, 2015 (Ackley); 60 pages.
U.S. Appl. No. 29/525,068 for Tablet Computer With Removable Scanning Device filed Apr. 27, 2015 (Schulte et al.); 19 pages.
U.S. Appl. No. 29/468,118 for an Electronic Device Case, filed Sep. 26, 2013 (Oberpriller et al.); 44 pages.
U.S. Appl. No. 29/530,600 for Cyclone filed Jun. 18, 2015 (Vargo et al); 16 pages.
U.S. Appl. No. 14/707,123 for Application Independent DEX/UCS Interface filed May 8, 2015 (Pape); 47 pages.
U.S. Appl. No. 14/283,282 for Terminal Having Illumination and Focus Control filed May 21, 2014 (Liu et al.); 31 pages; now abandoned.
U.S. Appl. No. 14/705,407 for Method and System to Protect Software-Based Network-Connected Devices From Advanced Persistent Threat filed May 6, 2015 (Hussey et al.); 42 pages.
U.S. Appl. No. 14/704,050 for Intermediate Linear Positioning filed May 5, 2015 (Charpentier et. al.); 60 pages.
U.S. Appl. No. 14/705,012 for Hands-Free Human Machine Interface Responsive to a Driver of a Vehicle filed May 6, 2015 (Fitch et al.); 44 pages.
U.S. Appl. No. 14/715,672 for Auguemented Reality Enabled Hazard Display filed May 19, 2015 (Venkatesha et al.); 35 pages.
U.S. Appl. No. 14/735,717 for Indicia-Reading Systems Having an Interface With a User'S Nervous System filed Jun. 10, 2015 (Todeschini); 39 pages.
U.S. Appl. No. 14/702,110 for System and Method for Regulating Barcode Data Injection Into a Running Application on a Smart Device filed May 1, 2015 (Todeschini et al.); 38 pages.
U.S. Appl. No. 14/747,197 for Optical Pattern Projector filed Jun. 23, 2015 (Thuries et al.); 33 pages.
U.S. Appl. No. 14/702,979 for Tracking Battery Conditions filed May 4, 2015 (Young et al.); 70 pages.
U.S. Appl. No. 29/529,441 for Indicia Reading Device filed Jun. 8, 2015 (Zhou et al.); 14 pages.
U.S. Appl. No. 14/747,490 for Dual-Projector Three-Dimensional Scanner filed Jun. 23, 2015 (Jovanovski et al.); 40 pages.
U.S. Appl. No. 14/740,320 for Tactile Switch for a Mobile Electronic Device filed Jun. 16, 2015 (Barndringa); 38 pages.
U.S. Appl. No. 14/740,373 for Calibrating a Volume Dimensioner filed Jun. 16, 2015 (Ackley et al.); 63 pages.
U.S. Appl. No. 13/367,978, filed Feb. 7, 2012, (Feng et al.); now abandoned.
U.S. Appl. No. 14/277,337 for Multipurpose Optical Reader, filed May 14, 2014 (Jovanovski et al.); 59 pages; now abandoned.
U.S. Appl. No. 14/446,391 for Multifunction Point of Sale Apparatus With Optical Signature Capture filed Jul. 30, 2014 (Good et al.); 37 pages; now abandoned.
U.S. Appl. No. 29/516,892 for Table Computer filed Feb. 6, 2015 (Bidwell et al.); 13 pages.
U.S. Appl. No. 29/523,098 for Handle for a Tablet Computer filed Apr. 7, 2015 (Bidwell et al.); 17 pages.
U.S. Appl. No. 29/528,890 for Mobile Computer Housing filed Jun. 2, 2015 (Fitch et al.); 61 pages.
U.S. Appl. No. 29/526,918 for Charging Base filed May 14, 2015 (Fitch et al.); 10 pages.
Article 94 (3) Communication for European Application No. 18172770. 2, dated Sep. 20, 2019, 8 pages.
U.S. Patent Application for a Laser Scanning Module Employing an Elastomeric U-Hinge Based Laser Scanning Assembly, filed Feb. 7, 2012 (Feng et al.), U.S. Appl. No. 13/367,978.
U.S. Patent Application for Indicia Reader filed Apr. 1, 2015 (Huck), U.S. Appl. No. 14/676,109.
Annex to the communication dated May 19, 2020 for EP Application No. 18172770.2, 8 pages.
Summons to Attend Oral Proceedings Mailed on May 19, 2020 for EP Application No. 18172770.2, 2 pages.

* cited by examiner

METHODS FOR ESTIMATING A NUMBER OF WORKFLOW CYCLES ABLE TO BE COMPLETED FROM A REMAINING BATTERY CAPACITY

FIELD OF THE INVENTION

The present invention relates to battery-powered mobile devices, and more particularly, relates to estimating a number of workflow cycles able to be completed from the remaining battery capacity of a battery in the battery-powered mobile device.

BACKGROUND

Mobile computer terminals or devices (hereinafter "mobile devices" or simply "devices") are used for a wide variety of tasks. Such mobile devices allow workers using them ("users") to maintain mobility, while providing the users with desirable computing and data gathering and processing functions. One example of a specific use for a mobile device is within a product management system that involves product distribution and tracking as well as product inventory management. Such systems are sometimes referred to as warehouse management systems (WMS). In a conventional WMS system, a large number of users (each using a mobile device) are directed, through speech, to move throughout a warehouse and complete various tasks, such as to pick certain products to fill an order or to put away or replenish items at storage locations. To that end, the mobile devices are loaded prior to the start of each user work shift with one or more work applications. Such work applications each include a plurality of tasks that are to be performed by the user in a particular workflow cycle. The work application is then executed by the mobile device, with the mobile device facilitating execution of the work application. In that way, the workflow cycle is completed (more particularly, the various tasks of the work application are completed) and data that is associated with the work application/workflow cycle is generated and collected.

Such mobile devices utilize portable power elements, such as batteries for power. The power consumption of the mobile device facilitating execution of the work application may vary somewhat radically based upon the work application that is being executed on the mobile device. The load on the CPU or other processor required by a work application may be different between various work applications. For example, some work applications consume power in bursting spikes of high power consumption, while other work applications might consume a higher consistent and average amount of power.

While the user may know the remaining battery capacity from a fuel gauge (an exemplary battery monitor) of the mobile device or another source, the current mobile device user cannot translate the fuel gauge information (remaining battery capacity) into the number of workflow cycles that can be completed with the mobile device facilitating execution of a particular work application. Therefore, the user may unexpectedly have to change or recharge a battery in the middle of a particular work application or shift, if the remaining battery capacity becomes too low or if power is lost. Recharging or changing batteries or losing power within the middle of a particular work application or shift cuts down on the efficiency of a user, and therefore, increases the overall cost of performing the workflow cycle.

Therefore, a need exists for methods for estimating a number of workflow cycles able to be completed from the remaining battery capacity of a battery in the battery-powered mobile device facilitating execution of a particular work application.

SUMMARY

Accordingly, in one aspect, the present invention embraces a method for generating an estimated number of workflow cycles able to be executed with a remaining battery capacity of a battery in a device. The method comprises defining a workflow cycle comprising a predefined series of tasks of a work application executed during a defined timeframe. A beginning battery capacity of a battery in the device is determined at a start of an execution of the work application. An end battery capacity of the battery in the device at completion of execution of the work application is determined. The beginning battery capacity and the end battery capacity comprise battery usage data. A battery usage estimate associated with the work application is calculated from a difference between the beginning battery capacity and the end battery capacity. At least one of the battery usage data and the battery usage estimate associated with the work application is stored. The remaining battery capacity at a start of another execution of the workflow cycle is determined. The estimated number of workflow cycles able to be executed based on the remaining battery capacity and the battery usage estimate is calculated.

In an exemplary embodiment, a method comprises determining a remaining battery capacity of a battery in a battery-powered device configured to facilitate execution of a work application in a workflow cycle. An estimated number of the workflow cycle able to be executed with the battery-powered device is determined by dividing the remaining battery capacity by a battery usage estimate associated with the work application. The estimated number of the predefined workflow cycle able to be executed is outputted.

In another exemplary embodiment, a method is provided for providing a user of a battery-powered device with an estimated number of a workflow cycle able to be executed with the battery-powered device configured to facilitate execution of a work application. The method comprises determining a remaining battery capacity of a battery in the battery-powered device, calculating the estimated number from the remaining battery capacity and a battery usage estimate associated with the work application, and outputting the estimated number to the user. The estimated number comprises a quotient obtained by dividing the remaining battery capacity by the battery usage estimate.

The foregoing illustrative summary, as well as other exemplary objectives and/or advantages of the invention, and the manner in which the same are accomplished, are further explained within the following detailed description and its accompanying drawings.

DETAILED DESCRIPTION

Various embodiments are directed to methods for generating an estimated number of workflow cycles able to be executed with a remaining battery capacity of a battery in a mobile device (a "battery-powered mobile device" or simply "device"). The mobile device is configured to facilitate execution of a work application. As used herein, the term "workflow cycle" comprises a defined timeframe in which the "work application" comprising a predefined series of tasks is executed. Therefore, the estimated number of workflow cycles able to be executed refers to the number of times that the work application may be executed from beginning to end.

As noted previously, users of battery-powered mobile devices have a difficult time translating current battery fuel gauge information (e.g., remaining battery capacity) into predictive workflow operation cycles. For example, while a user may determine the percentage of charge remaining in the battery of the mobile device (i.e., the remaining battery capacity) from, for example, a battery monitor, the user currently cannot determine the number of workflow cycles that can be performed with the remaining charge. Various embodiments generate an estimated number of workflow cycles able to be executed with the remaining battery capacity of the battery in the mobile device configured to help facilitate execution of a particular work application in a single workflow cycle. Various embodiments enable a user to know in advance of performing the workflow cycle if the workflow cycle can be completed (i.e., all the tasks of the particular work application completed) with the remaining battery capacity, and specifically how many workflow cycles he/she can complete before power is lost or until a minimum power threshold is reached. Therefore, various embodiments reduce the need to recharge/change a battery within the middle of a particular work application or shift. Various embodiments also reduce the chance of losing power within the middle of a particular work application or shift. Therefore, the efficiency of a user may be increased, with a corresponding decrease in the overall cost of the workflow cycle.

Figure 1:
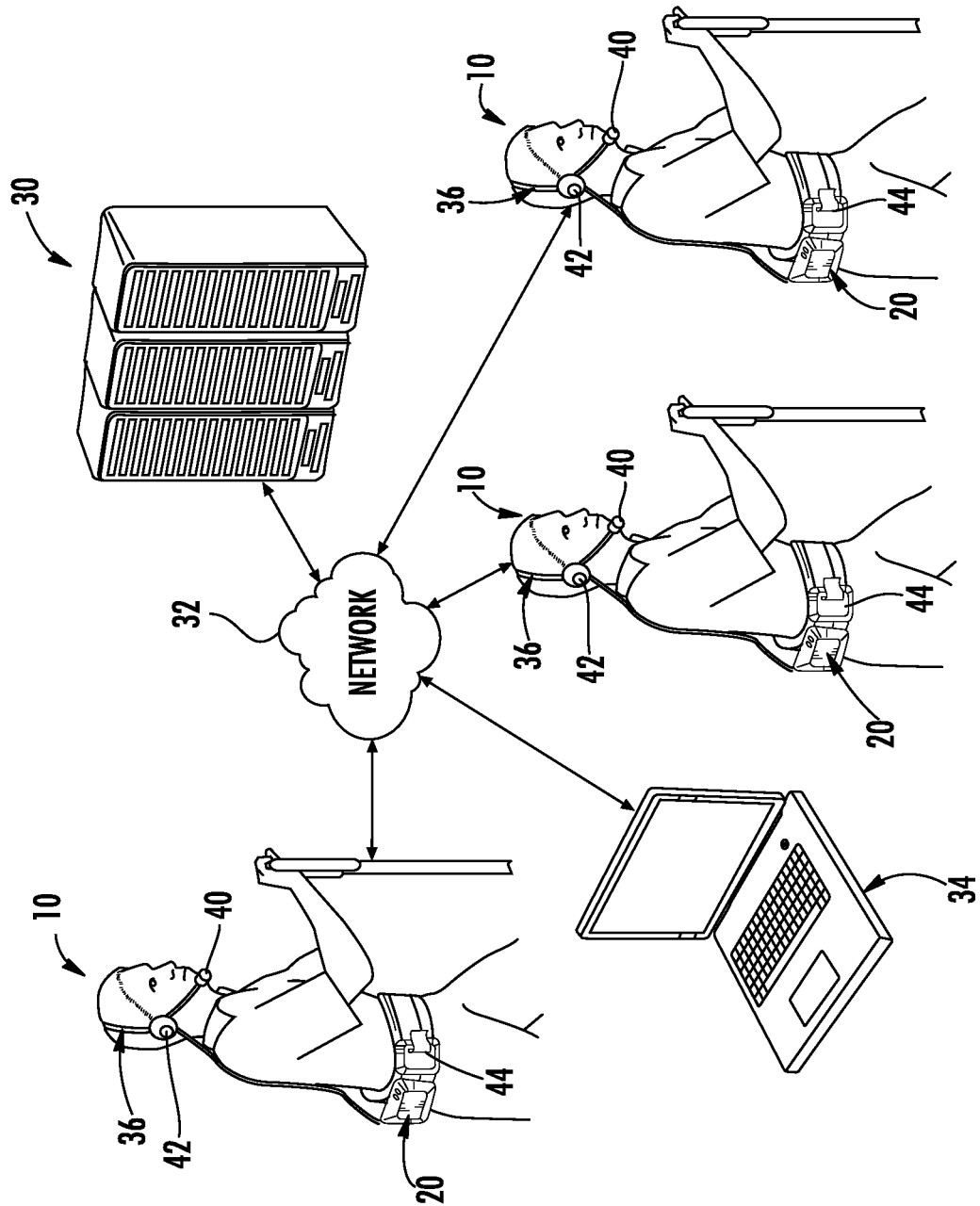
FIG. 1 is a diagrammatic illustration of an exemplary mobile device workplace environment including workers having mobile devices and a management computer in communication with the mobile devices in accordance with various embodiments of the present invention.

Referring now to FIG. 1, an exemplary mobile device workplace environment is depicted including a plurality of workers or users 10. As shown in FIG. 1, the users are equipped with battery-powered portable or mobile devices 20 that are in communication with a WMS system computer or server over a communication network 32. Each mobile device may also be in communication with a management computer 34 that runs management software for managing the mobile device 20. The WMS system computer or server and the management computer are well known in the art, and therefore will not be described in any further detail here. The mobile device may communicate with one or more of the management computers 34 for the purposes of managing and configuring the mobile device, loading work applications onto the mobile device, managing the users that are working with the mobile device, and providing system diagnostics. The management computer may process collected data. For the various embodiments discussed herein, the mobile device is a mobile computer terminal that utilizes speech functionality. However, the present invention is not limited to such terminals, and will have applicability to other mobile devices that implement specific applications using a battery.

In accordance with various embodiments of the present invention, the mobile device is configured to facilitate execution of the work application in a workflow cycle as noted previously. For example, in work environments (such as depicted in FIG. 1) where workers or users wear mobile devices to receive instructions related to tasks to be performed by the worker (such as in a warehouse management system (WMS)), the work application may be loaded onto the mobile devices, for example wirelessly by an IT department or the like and updated periodically. Using a speech dialog through the mobile device and headset, a user is directed to move around to various locations, to perform the various tasks of the work application and to respond to inquiries using speech. In that way, the various tasks are completed.

Each mobile device may be coupled with a suitable headset 36 to be worn by a user for interfacing with the mobile device using speech. The headset 36 includes one or more microphones 40 that capture user speech and one or more speakers 42 that play speech commands to a user, such as to direct the user through the plurality of tasks of the particular work application being executed or run in the workflow cycle by the mobile device.

In addition to the speech dialog, various peripheral devices may be implemented and interfaced with the mobile device, such as a barcode or RFID reader, a display, a printer, or other devices to operate in conjunction with the speech dialog for facilitating the various work tasks of the work application in the workflow cycle. For example, the mobile device may be coupled with one or more peripheral devices. For example, FIG. 1 illustrates each of the mobile devices coupled with a portable printer 44.

Figure 2:
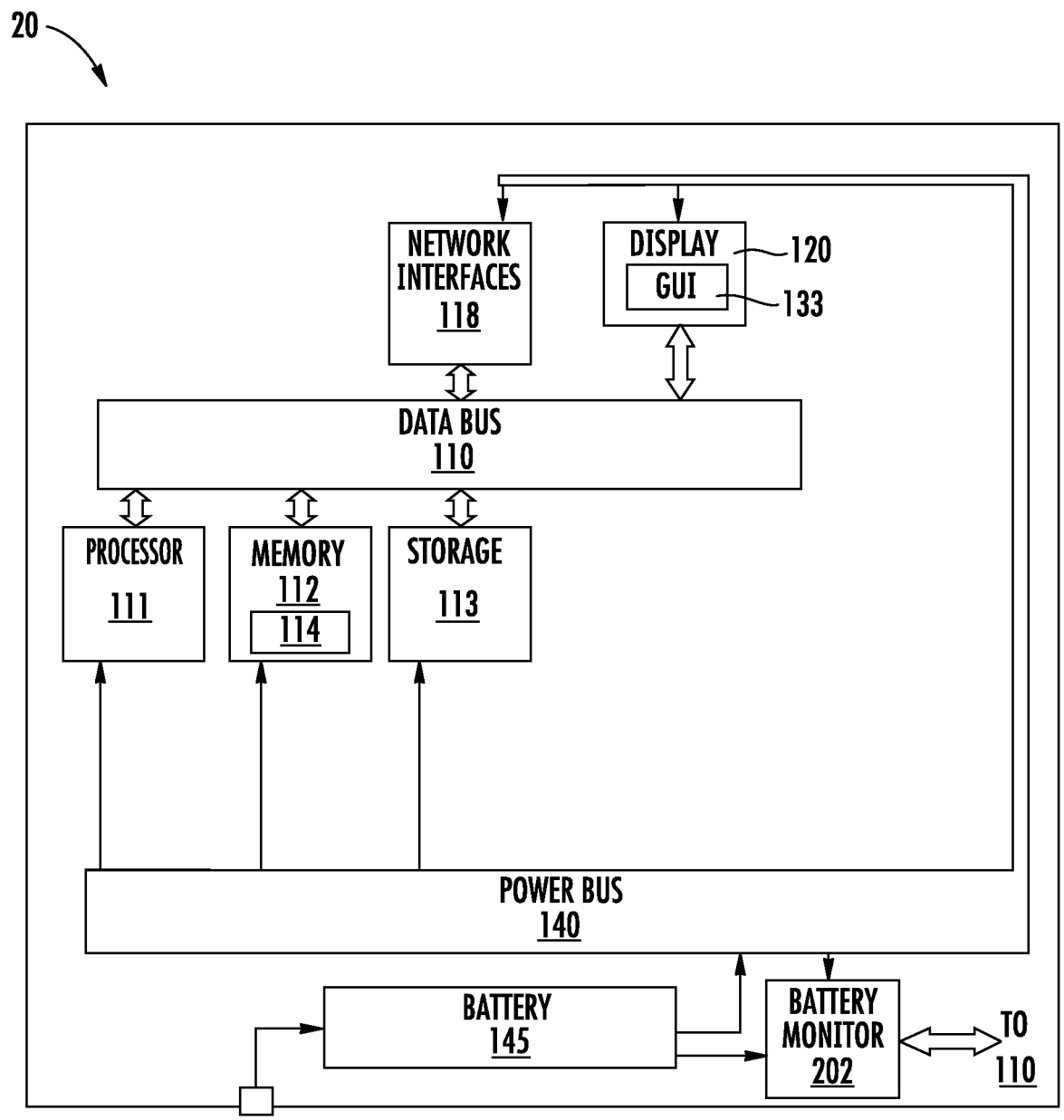
FIG. 2 is a schematic diagram of exemplary components of one of the mobile device of FIG. 1, according to various embodiments of the present invention.

Referring now to FIG. 2, according to various embodiments, an exemplary mobile device 20 configured to execute a work application in a workflow cycle is depicted. The exemplary mobile device includes a processor 111 and memory 112, where memory 112 includes one or more software applications 114 resident in memory 112. For example, such software applications may comprise one or more applications configured to be executed by processor 111, such as the work applications that include a series of tasks to be performed by a user in a predefined timeframe comprising the workflow cycle. Software applications 114 may also be configured to include battery usage data and/or battery usage estimates as hereinafter described.

The mobile device 20 may also include one or more I/O network interfaces 118 to transmit and receive communications between management computer 104 and the mobile device over communication network 32. The I/O interface 118 may also be configured to receive input from a variety of sources including for example, speech input from a headset microphone or scanner/reader input from a barcode or RFID scanner/reader, and also to output data or communications, such as a text-to speech output to a headset speaker to be heard by a user. Suitable mobile devices for implementing the present invention are the TALKMAN® devices available from Honeywell International, Inc.

The processor 111 of the mobile device 20 may execute computer program code in one or more memory 112 and/or storage devices 113 of the mobile device, and that memory may represent random access memory (RAM) devices comprising the main storage of a computer, as well as any supplemental levels of memory, e.g., cache memories, nonvolatile or backup memories (e.g., programmable or flash memories), read-only memories, etc. In addition, a memory may be considered to include memory storage physically located elsewhere in a computer, e.g., any cache memory in a processor, as well as any storage capacity used as a virtual memory, e.g., as stored on a mass storage device or on another interconnected computer.

Figure 3:
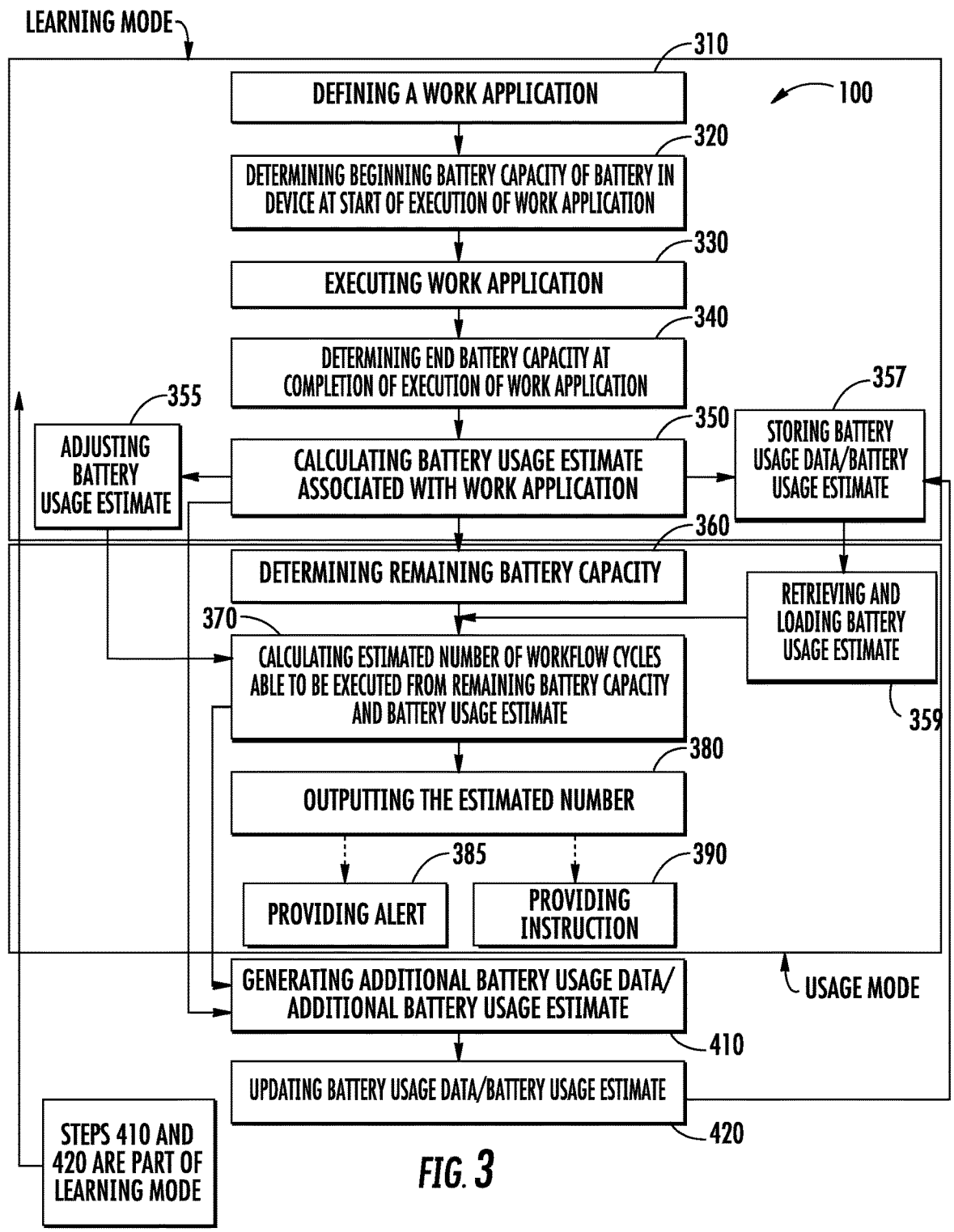
FIG. 3 is a flow diagram illustrating a method for estimating a number of workflow cycles able to be completed from the remaining battery capacity of a battery in the mobile device of FIGS. 1 and 2.

Still referring to FIG. 2, in accordance with various embodiments of the present invention, the subsystems in the exemplary mobile device of FIG. 3 are electrically connected via a coupler (e.g., wires, traces, etc.) to form an interconnection subsystem. The interconnection system may include power buses or lines (e.g., power bus 140 of FIG. 2), data buses (e.g., data bus 110 of FIG. 2), instruction buses, address buses, etc., which allow operation of the modules/subsystems and the interaction there between. For example, FIG. 2 depicts the power bus 140 electrically connected to a plurality of exemplary components in the depicted exemplary mobile device useful in the methods for estimating the number of workflow cycles able to be executed with a remaining battery capacity of the battery in the mobile device configured to facilitate execution of the work application. The power bus 140 is depicted as connected to the processor 111, the memory 112, storage 113, the network interface 118, and a display 120 of the exemplary mobile device 20. The data bus 110 connects the processor, the memory, and storage, to the network interface 118 and the display. The display 120 may include a graphical user interface 133. It is to be understood that there may be a fewer or a greater number of components in the mobile device. In addition, there may be more than one of any component identified in FIG. 2 according to various embodiments of the present invention.

Still referring to FIG. 2, the mobile device also includes a power source, such as the battery 145 that provides power to the processor and other electronic circuitry of the devices for their operation. The mobile device also includes a fuel gauge (e.g., battery monitor 202) coupled to the battery. The battery life of each mobile device is monitored by the battery monitor 202 and managed during its use so that the user knows the remaining battery capacity of the battery in the mobile device. The battery monitor or the like provides an indication to the user of the existing battery life (i.e., the remaining battery capacity) for the battery in the mobile device during execution of the particular work application.

Referring now to FIG. 3, according to various embodiments of the present invention, a method 100 for generating an estimated number of workflow cycles able to be executed with a remaining battery capacity of a battery in the device comprises defining the work application of a workflow cycle (step 310) (more particularly, defining the tasks that make up the work application). This step may be performed any time prior to executing the work application in the workflow cycle.

Still referring to FIG. 3, according to various embodiments of the present invention, the method 100 for generating an estimated number of workflow cycles able to be executed with a remaining battery capacity of a battery in the device continues by determining a beginning battery capacity of the battery in the mobile device 20 at a start of an execution of the work application (step 320). The beginning battery capacity, an end battery capacity, and the remaining battery capacity are determined from the battery monitor 202 in the mobile device. In accordance with various embodiments of the present invention, the battery monitor 202 or the like may provide an indication to the user of the existing battery life for the battery in the mobile device at the start of the execution of the particular work application (i.e., "a beginning battery capacity"). As hereinafter described, the battery monitor or the like also provides an indication to the user of the existing battery life at completion of execution of the work application (the "end battery capacity"). Battery usage is monitored and data is collected based on the particular work application. The beginning battery capacity data and the end battery capacity data are included in "battery usage data". Battery usage data may also include other information, such as the run-time of work application being executed, as well as changes in operating parameters of the battery, during execution of the work application. In accordance with various embodiments of the present invention, battery usage data is generated during execution of a work application.

Still referring to FIG. 3, according to various embodiments of the present invention, the method 100 for generating an estimated number of workflow cycles able to be executed with a remaining battery capacity of a battery in the mobile device continues by executing the work application in the workflow cycle (step 330). A single workflow cycle is completed by completing execution of the work application (i.e., by completing the predefined tasks of the work application in the defined timeframe).

Still referring to FIG. 3, according to various embodiments of the present invention, the method 100 for generating an estimated number of workflow cycles able to be executed with a remaining battery capacity of a battery in the device continues by determining an end battery capacity of the battery in the device at completion of execution of the workflow cycle (step 340). As noted previously, the end battery capacity can be determined from the battery monitor.

Still referring to FIG. 3, according to various embodiments of the present invention, the method 100 for generating an estimated number of workflow cycles able to be executed with a remaining battery capacity of a battery in the device continues by calculating a battery usage estimate associated with the particular work application from a difference between the beginning battery capacity and the end battery capacity (step 350), i.e., the battery usage estimate comprises the difference in battery capacity at the start of execution of the work application (the beginning battery capacity) and the battery capacity at completion of execution of the predefined workflow cycle (the end battery capacity). The battery usage estimate represents the estimated power consumed during execution of the particular work application in a single workflow cycle.

As hereinafter described, in accordance with various embodiments of the present invention, the battery usage estimate is used to estimate the number of workflow cycles able to be completed with the remaining battery capacity of the battery in the mobile device facilitating execution of the particular work application. While the battery usage estimate may be calculated (the difference between the beginning battery capacity and the end battery capacity) from execution of the particular work application in a single workflow cycle, it is to be understood that greater accuracy in the battery usage estimate may be achieved from multiple executions of the particular work application over multiple workflow cycles and/or by multiple mobile devices, i.e., the battery usage estimate is best developed from a large number of uses as previously noted, and thus, a plurality of work application executions may be monitored, such as by the management computer 104. The work applications may be executed on a plurality of battery-powered devices by users doing work and/or over a plurality of workflow cycles by the same user or different users.

In accordance with various embodiments of the present invention, the battery usage data (including the beginning battery capacity and the end battery capacity) from executing the particular work application over one or more workflow cycles and/or from a plurality of mobile devices executing generally the same particular work application may be stored and aggregated and/or averaged for the purpose of calculating the battery usage estimate, as hereinafter described. For example, the battery usage data for all mobile devices that are executing generally the same work application may be aggregated and/or averaged for calculating an average battery usage estimate for a fully-charged battery executing the particular work application. Battery usage data for a plurality of different devices that are each executing the work application may be stored and aggregated and/or averaged. The aggregated battery usage data for the various monitored battery performance metrics are stored and associated with a specific work application. Using that battery usage data, the battery usage estimate is calculated, such as by the mobile device and/or the management computer 104. The battery usage estimate is associated with the particular work application.

The battery usage data and/or battery usage estimate may be updated as additional battery usage data and additional battery usage estimates are generated and collected. For example, the battery usage estimate associated with the particular work application may be aggregated and/or averaged over a plurality of devices so that the battery usage estimate for the mobile devices executing the particular work application may be determined. The battery usage estimate may be accumulated and stored in memory and associated with the particular work application. The battery usage estimate may be continuously updated, as more work applications are executed and more data is aggregated and/or averaged for the particular work application.

In accordance with various embodiments of the present invention, the battery usage estimate from one or more executions of the particular work application may be used for calculating the estimated number of workflow cycles able to be executed with the remaining battery capacity, according to various embodiments of the present invention. For example, the battery usage estimate from one or more prior executions may be used for the calculation, in which case the battery usage estimate comprises an "historical battery usage estimate". The historical battery usage estimate may be an aggregated and/or averaged battery usage estimate.

The battery usage estimate is application-specific with respect to a monitored work application. The battery usage estimate may be calculated using the aggregated and stored battery usage data. After data has been aggregated, a determination might be made regarding whether a battery usage estimate exists for the particular work application associated with the data. If not, a battery usage estimate might be calculated for the particular work application. If a battery usage estimate already exists, any newly-aggregated data might be used to update that battery usage estimate.

Still referring to FIG. 3, in accordance with various embodiments of the present invention, the battery usage estimate associated with the work application may be adjusted to account for one or more current environmental factors (i.e., to account for environmental factors that may have changed since generation of the historical battery usage estimate (e.g., temperature where the work application is being executed, radio signal strength, etc.) that may impact the battery usage estimate (step 355).

Still referring to FIG. 3, according to various embodiments of the present invention, the method 100 for generating an estimated number of workflow cycles able to be executed with a remaining battery capacity of a battery in the device continues by storing at least one of the battery usage data and the battery usage estimate associated with the work application (step 357). As noted previously, the battery usage data may be aggregated and/or averaged with battery usage data from other mobile devices executing the same particular work application and/or over multiple workflow cycles. Battery usage data and/or battery usage estimates may be stored in memory of the mobile device and/or management computer 34, and may be transmitted over communication network 32 to be loaded onto the mobile device.

As depicted in FIG. 3, steps 310 through 357 are considered part of a "learning mode" during which time the mobile device is measuring the power consumed while executing the particular work application in a particular workflow cycle to be able to calculate the battery usage estimate and to store the battery usage data/battery usage estimates to be used in a "battery mode" as hereinafter described.

In the "battery mode", as hereinafter described and depicted in FIG. 3, the battery usage estimate from the "learning mode" may then be retrieved and loaded onto the mobile device that is loaded with the particular work application for which battery usage data has been generated and collected (step 359). Once a battery usage estimate is established and tied to a particular work application, it can be implemented and loaded onto a device each time, for each workflow cycle, that the mobile device will be used for that particular work application. The battery usage estimate may be loaded onto any mobile device that is loaded with and will be executing that particular work application. Based upon that loaded battery usage estimate, the estimated number of workflow cycles able to be executed with the remaining battery capacity of the battery in the mobile device configured to facilitate execution of the work application may be calculated by the mobile device and/or the management computer before the particular work application is executed. Battery usage estimates may be updated and/or loaded as desired based on the application and use of the device. Once a battery usage estimate is loaded onto a device, the device will operate utilizing that battery usage estimate, Still referring to FIG. 3, according to various embodiments of the present invention, the method 100 for estimating a number of workflow cycles able to be executed with a remaining battery capacity of a battery in the device continues by determining the remaining battery capacity at a start of execution of the particular work application in another workflow cycle (step 360). In accordance with various embodiments of the present invention, if a battery usage estimate is already available, the method for estimating a number of workflow cycles able to be executed with a remaining battery capacity of a battery in the device may begin with step 360.

Still referring to FIG. 3, according to various embodiments of the present invention, the method 100 for generating an estimated number of workflow cycles able to be executed with a remaining battery capacity of a battery in the device continues by calculating the estimated number of workflow cycles able to be executed based on the remaining battery capacity and the battery usage estimate (step 370). The battery usage estimate may be from step 350 or by retrieving and loading the stored battery usage estimate (step 359) from step 357 (storing the battery usage estimate). As noted previously, prior to calculating the estimated number and in response to loading of the work application on the mobile device for execution thereof in another workflow cycle, the battery usage estimate from step 350 or from steps 357 and 359 may be used in calculating the estimated number of workflow cycles able to be executed from the remaining battery capacity. The estimated number of the workflow cycles able to be executed with the battery-powered device configured to facilitate execution of the particular work application associated with the battery usage estimate may be determined by dividing the remaining battery capacity by the battery usage estimate associated with the particular work application. The estimated number of the predefined workflow cycles able to be executed with the battery-powered device comprises the quotient obtained by dividing the remaining battery capacity with the battery usage estimate.

Figure 4:
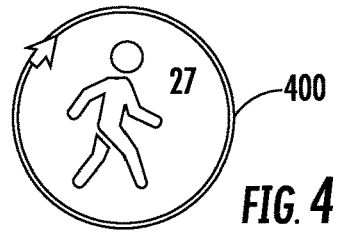
FIG. 4 is an exemplary display icon representing the estimated number of workflow cycles able to be completed from the remaining battery capacity of the battery in the mobile device, according to various embodiments of the present invention.

Still referring to FIG. 3, according to various embodiments of the present invention, the method 100 for generating an estimated number of workflow cycles able to be executed with a remaining battery capacity of a battery in the device continues by outputting the estimated number (step 380). The mobile device may provide indications to the user of the device with respect to the estimated number of workflow cycles able to be executed with the remaining battery capacity of the device. The indication might be provided through the speech dialog in a speech-based device of system. Alternatively, other indication methods might be utilized, such as through a graphic display, or through indicator lights or some other appropriate manner of providing a perceptible indication to a user of a device. For example, FIG. 4 depicts an exemplary icon 400 with the number 27 comprising the (exemplary) estimated number of workflow cycles able to be completed with the remaining battery capacity of the device. Threshold points can be set to change background color, etc. as the estimated number counts down. For example, when the estimated number of workflow cycles able to be executed reaches, for example 10, the icon background color may change to yellow, and when the estimated number of workflow cycles able to be executed is down to 5, the icon background color may change to red. It is to be understood that the various thresholds, background colors, etc., if used, may be different than those described herein.

Still referring to FIG. 3, according to various embodiments of the present invention, the method 100 for generating an estimated number of workflow cycles able to be executed with a remaining battery capacity of a battery in the device may further comprise providing an alert if the estimated number is less than a predetermined minimum number (step 385).

Still referring to FIG. 3, according to various embodiments of the present invention, the method 100 for generating an estimated number of workflow cycles able to be executed with a remaining battery capacity of a battery in the device may further comprise providing instructions to recharge or replace the battery if the estimated number is less than a predetermined minimum number (step 390). Steps 385 and/or 390 may be performed according to various embodiments of the present invention. The "Usage Mode" includes steps 359, and steps 360-390. The Usage Mode includes the running workflows and using the remaining battery capacity and battery usage estimate to calculate the estimated number of workflow cycles able to be executed from the remaining battery capacity.

Still referring to FIG. 3, according to various embodiments, the method 100 for generating an estimated number of workflow cycles able to be executed with a remaining battery capacity of a battery in the device may further comprise generating additional battery usage data and an additional battery usage estimate when another workflow cycle is executed by the mobile device (step 410). The battery usage estimate and/or the battery usage data from prior execution of one or more of the workflow cycles may be updated with the additional battery usage data and the additional battery usage estimate (step 420). The aggregated and/or averaged battery usage data and/or battery usage estimate may be stored (step 357) for later retrieval and loading (step 359) in another workflow cycle. Steps 410 and 420 may be performed immediately after step 350, during steps 360 through 380, or after step 380. Steps 410 and 420 may also be considered part of the learning mode as depicted in FIG. 3.

From the foregoing, it is to be understood that the application-specific battery usage estimate may be used for a facility handling a number of different work applications, such as a warehouse facility. Application-specific battery usage estimates may be developed for each of the work applications handled at such a facility for more accurately providing the user with an estimated number of workflow cycles able to be completed with the remaining battery capacity of the battery used in the mobile device for executing the particular work application.

The routines executed to implement the embodiments of the invention, including the execution of routines associated with a battery usage estimate loaded on a device or associated with the aggregation of battery usage data or the generation of a battery usage estimate, whether implemented as part of an operating system or a specific application, component, program, object, module or sequence of instructions executed by one or more computing systems is referred to herein as a "sequence of operations," a "program product," or, more simply, "program". The program typically comprises one or more instructions that are resident at various times in various memory and storage devices in a computing system or device (e.g., the mobile terminal device, the management computer, etc.), and that, when read and executed by one or more processors of the system, cause the system to perform the steps necessary to execute steps, elements, and/or blocks embodying the various aspects of the invention. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, APIs, applications, applets, etc.), it should be appreciated that the invention is not limited to the specific organization and allocation of program functionality described herein.

To supplement the present disclosure, this application incorporates entirely by reference the following commonly assigned patents, patent application publications, and patent applications:

U.S. Pat. Nos. 6,832,725; 7,128,266;
U.S. Pat. Nos. 7,159,783; 7,413,127;
U.S. Pat. Nos. 7,726,575; 8,294,969;
U.S. Pat. Nos. 8,317,105; 8,322,622;
U.S. Pat. Nos. 8,366,005; 8,371,507;
U.S. Pat. Nos. 8,376,233; 8,381,979;
U.S. Pat. Nos. 8,390,909; 8,408,464;
U.S. Pat. Nos. 8,408,468; 8,408,469;

U.S. Pat. Nos. 8,424,768; 8,448,863;
U.S. Pat. Nos. 8,457,013; 8,459,557;
U.S. Pat. Nos. 8,469,272; 8,474,712;
U.S. Pat. Nos. 8,479,992; 8,490,877;
U.S. Pat. Nos. 8,517,271; 8,523,076;
U.S. Pat. Nos. 8,528,818; 8,544,737;
U.S. Pat. Nos. 8,548,242; 8,548,420;
U.S. Pat. Nos. 8,550,335; 8,550,354;
U.S. Pat. Nos. 8,550,357; 8,556,174;
U.S. Pat. Nos. 8,556,176; 8,556,177;
U.S. Pat. Nos. 8,559,767; 8,599,957;
U.S. Pat. Nos. 8,561,895; 8,561,903;
U.S. Pat. Nos. 8,561,905; 8,565,107;
U.S. Pat. Nos. 8,571,307; 8,579,200;
U.S. Pat. Nos. 8,583,924; 8,584,945;
U.S. Pat. Nos. 8,587,595; 8,587,697;
U.S. Pat. Nos. 8,588,869; 8,590,789;
U.S. Pat. Nos. 8,596,539; 8,596,542;
U.S. Pat. Nos. 8,596,543; 8,599,271;
U.S. Pat. Nos. 8,599,957; 8,600,158;
U.S. Pat. Nos. 8,600,167; 8,602,309;
U.S. Pat. Nos. 8,608,053; 8,608,071;
U.S. Pat. Nos. 8,611,309; 8,615,487;
U.S. Pat. Nos. 8,616,454; 8,621,123;
U.S. Pat. Nos. 8,622,303; 8,628,013;
U.S. Pat. Nos. 8,628,015; 8,628,016;
U.S. Pat. Nos. 8,629,926; 8,630,491;
U.S. Pat. Nos. 8,635,309; 8,636,200;
U.S. Pat. Nos. 8,636,212; 8,636,215;
U.S. Pat. Nos. 8,636,224; 8,638,806;
U.S. Pat. Nos. 8,640,958; 8,640,960;
U.S. Pat. Nos. 8,643,717; 8,646,692;
U.S. Pat. Nos. 8,646,694; 8,657,200;
U.S. Pat. Nos. 8,659,397; 8,668,149;
U.S. Pat. Nos. 8,678,285; 8,678,286;
U.S. Pat. Nos. 8,682,077; 8,687,282;
U.S. Pat. Nos. 8,692,927; 8,695,880;
U.S. Pat. Nos. 8,698,949; 8,717,494;
U.S. Pat. Nos. 8,717,494; 8,720,783;
U.S. Pat. Nos. 8,723,804; 8,723,904;
U.S. Pat. No. 8,727,223; U.S. Pat. No. D702,237;
U.S. Pat. Nos. 8,740,082; 8,740,085;
U.S. Pat. Nos. 8,746,563; 8,750,445;
U.S. Pat. Nos. 8,752,766; 8,756,059;
U.S. Pat. Nos. 8,757,495; 8,760,563;
U.S. Pat. Nos. 8,763,909; 8,777,108;
U.S. Pat. Nos. 8,777,109; 8,779,898;
U.S. Pat. Nos. 8,781,520; 8,783,573;
U.S. Pat. Nos. 8,789,757; 8,789,758;
U.S. Pat. Nos. 8,789,759; 8,794,520;
U.S. Pat. Nos. 8,794,522; 8,794,525;
U.S. Pat. Nos. 8,794,526; 8,798,367;
U.S. Pat. Nos. 8,807,431; 8,807,432;
U.S. Pat. Nos. 8,820,630; 8,822,848;
U.S. Pat. Nos. 8,824,692; 8,824,696;
U.S. Pat. Nos. 8,842,849; 8,844,822;
U.S. Pat. Nos. 8,844,823; 8,849,019;
U.S. Pat. Nos. 8,851,383; 8,854,633;
U.S. Pat. Nos. 8,866,963; 8,868,421;
U.S. Pat. Nos. 8,868,519; 8,868,802;
U.S. Pat. Nos. 8,868,803; 8,870,074;
U.S. Pat. Nos. 8,879,639; 8,880,426;
U.S. Pat. Nos. 8,881,983; 8,881,987;
U.S. Pat. Nos. 8,903,172; 8,908,995;
U.S. Pat. Nos. 8,910,870; 8,910,875;
U.S. Pat. Nos. 8,914,290; 8,914,788;
U.S. Pat. Nos. 8,915,439; 8,915,444;
U.S. Pat. Nos. 8,916,789; 8,918,250;
U.S. Pat. Nos. 8,918,564; 8,925,818;
U.S. Pat. Nos. 8,939,374; 8,942,480;
U.S. Pat. Nos. 8,944,313; 8,944,327;
U.S. Pat. Nos. 8,944,332; 8,950,678;
U.S. Pat. Nos. 8,967,468; 8,971,346;
U.S. Pat. Nos. 8,976,030; 8,976,368;
U.S. Pat. Nos. 8,978,981; 8,978,983;
U.S. Pat. Nos. 8,978,984; 8,985,456;
U.S. Pat. Nos. 8,985,457; 8,985,459;
U.S. Pat. Nos. 8,985,461; 8,988,578;
U.S. Pat. Nos. 8,988,590; 8,991,704;
U.S. Pat. Nos. 8,996,194; 8,996,384;
U.S. Pat. Nos. 9,002,641; 9,007,368;
U.S. Pat. Nos. 9,010,641; 9,015,513;
U.S. Pat. Nos. 9,016,576; 9,022,288;
U.S. Pat. Nos. 9,030,964; 9,033,240;
U.S. Pat. Nos. 9,033,242; 9,036,054;
U.S. Pat. Nos. 9,037,344; 9,038,911;
U.S. Pat. Nos. 9,038,915; 9,047,098;
U.S. Pat. Nos. 9,047,359; 9,047,420;
U.S. Pat. Nos. 9,047,525; 9,047,531;
U.S. Pat. Nos. 9,053,055; 9,053,378;
U.S. Pat. Nos. 9,053,380; 9,058,526;
U.S. Pat. Nos. 9,064,165; 9,064,167;
U.S. Pat. Nos. 9,064,168; 9,064,254;
U.S. Pat. Nos. 9,066,032; 9,070,032;
U.S. Design Pat. No. D716,285;
U.S. Design Pat. No. D723,560;
U.S. Design Pat. No. D730,357;
U.S. Design Pat. No. D730,901;
U.S. Design Pat. No. D730,902;
U.S. Design Pat. No. D733,112;
U.S. Design Pat. No. D734,339;
International Publication No. 2013/163789;
International Publication No. 2013/173985;
International Publication No. 2014/019130;
International Publication No. 2014/110495;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2010/0265880;
U.S. Patent Application Publication No. 2011/0202554;
U.S. Patent Application Publication No. 2012/0111946;
U.S. Patent Application Publication No. 2012/0168511;
U.S. Patent Application Publication No. 2012/0168512;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0287258;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;

U.S. Patent Application Publication No. 2013/0306731;
U.S. Patent Application Publication No. 2013/0307964;
U.S. Patent Application Publication No. 2013/0308625;
U.S. Patent Application Publication No. 2013/0313324;
U.S. Patent Application Publication No. 2013/0313325;
U.S. Patent Application Publication No. 2013/0342717;
U.S. Patent Application Publication No. 2014/0001267;
U.S. Patent Application Publication No. 2014/0008439;
U.S. Patent Application Publication No. 2014/0025584;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061306;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. Patent Application Publication No. 2014/0076974;
U.S. Patent Application Publication No. 2014/0078341;
U.S. Patent Application Publication No. 2014/0078345;
U.S. Patent Application Publication No. 2014/0097249;
U.S. Patent Application Publication No. 2014/0098792;
U.S. Patent Application Publication No. 2014/0100813;
U.S. Patent Application Publication No. 2014/0103115;
U.S. Patent Application Publication No. 2014/0104413;
U.S. Patent Application Publication No. 2014/0104414;
U.S. Patent Application Publication No. 2014/0104416;
U.S. Patent Application Publication No. 2014/0104451;
U.S. Patent Application Publication No. 2014/0106594;
U.S. Patent Application Publication No. 2014/0106725;
U.S. Patent Application Publication No. 2014/0108010;
U.S. Patent Application Publication No. 2014/0108402;
U.S. Patent Application Publication No. 2014/0110485;
U.S. Patent Application Publication No. 2014/0114530;
U.S. Patent Application Publication No. 2014/0124577;
U.S. Patent Application Publication No. 2014/0124579;
U.S. Patent Application Publication No. 2014/0125842;
U.S. Patent Application Publication No. 2014/0125853;
U.S. Patent Application Publication No. 2014/0125999;
U.S. Patent Application Publication No. 2014/0129378;
U.S. Patent Application Publication No. 2014/0131438;
U.S. Patent Application Publication No. 2014/0131441;
U.S. Patent Application Publication No. 2014/0131443;
U.S. Patent Application Publication No. 2014/0131444;
U.S. Patent Application Publication No. 2014/0131445;
U.S. Patent Application Publication No. 2014/0131448;
U.S. Patent Application Publication No. 2014/0133379;
U.S. Patent Application Publication No. 2014/0136208;
U.S. Patent Application Publication No. 2014/0140585;
U.S. Patent Application Publication No. 2014/0151453;
U.S. Patent Application Publication No. 2014/0152882;
U.S. Patent Application Publication No. 2014/0158770;
U.S. Patent Application Publication No. 2014/0159869;
U.S. Patent Application Publication No. 2014/0166755;
U.S. Patent Application Publication No. 2014/0166759;
U.S. Patent Application Publication No. 2014/0168787;
U.S. Patent Application Publication No. 2014/0175165;
U.S. Patent Application Publication No. 2014/0175172;
U.S. Patent Application Publication No. 2014/0191644;
U.S. Patent Application Publication No. 2014/0191913;
U.S. Patent Application Publication No. 2014/0197238;
U.S. Patent Application Publication No. 2014/0197239;
U.S. Patent Application Publication No. 2014/0197304;
U.S. Patent Application Publication No. 2014/0214631;
U.S. Patent Application Publication No. 2014/0217166;
U.S. Patent Application Publication No. 2014/0217180;
U.S. Patent Application Publication No. 2014/0231500;
U.S. Patent Application Publication No. 2014/0232930;
U.S. Patent Application Publication No. 2014/0247315;
U.S. Patent Application Publication No. 2014/0263493;
U.S. Patent Application Publication No. 2014/0263645;
U.S. Patent Application Publication No. 2014/0267609;
U.S. Patent Application Publication No. 2014/0270196;
U.S. Patent Application Publication No. 2014/0270229;
U.S. Patent Application Publication No. 2014/0278387;
U.S. Patent Application Publication No. 2014/0278391;
U.S. Patent Application Publication No. 2014/0282210;
U.S. Patent Application Publication No. 2014/0284384;
U.S. Patent Application Publication No. 2014/0288933;
U.S. Patent Application Publication No. 2014/0297058;
U.S. Patent Application Publication No. 2014/0299665;
U.S. Patent Application Publication No. 2014/0312121;
U.S. Patent Application Publication No. 2014/0319220;
U.S. Patent Application Publication No. 2014/0319221;
U.S. Patent Application Publication No. 2014/0326787;
U.S. Patent Application Publication No. 2014/0332590;
U.S. Patent Application Publication No. 2014/0344943;
U.S. Patent Application Publication No. 2014/0346233;
U.S. Patent Application Publication No. 2014/0351317;
U.S. Patent Application Publication No. 2014/0353373;
U.S. Patent Application Publication No. 2014/0361073;
U.S. Patent Application Publication No. 2014/0361082;
U.S. Patent Application Publication No. 2014/0362184;
U.S. Patent Application Publication No. 2014/0363015;
U.S. Patent Application Publication No. 2014/0369511;
U.S. Patent Application Publication No. 2014/0374483;
U.S. Patent Application Publication No. 2014/0374485;
U.S. Patent Application Publication No. 2015/0001301;
U.S. Patent Application Publication No. 2015/0001304;
U.S. Patent Application Publication No. 2015/0003673;
U.S. Patent Application Publication No. 2015/0009338;
U.S. Patent Application Publication No. 2015/0009610;
U.S. Patent Application Publication No. 2015/0014416;
U.S. Patent Application Publication No. 2015/0021397;
U.S. Patent Application Publication No. 2015/0028102;
U.S. Patent Application Publication No. 2015/0028103;
U.S. Patent Application Publication No. 2015/0028104;
U.S. Patent Application Publication No. 2015/0029002;
U.S. Patent Application Publication No. 2015/0032709;
U.S. Patent Application Publication No. 2015/0039309;
U.S. Patent Application Publication No. 2015/0039878;
U.S. Patent Application Publication No. 2015/0040378;
U.S. Patent Application Publication No. 2015/0048168;
U.S. Patent Application Publication No. 2015/0049347;
U.S. Patent Application Publication No. 2015/0051992;
U.S. Patent Application Publication No. 2015/0053766;
U.S. Patent Application Publication No. 2015/0053768;
U.S. Patent Application Publication No. 2015/0053769;
U.S. Patent Application Publication No. 2015/0060544;
U.S. Patent Application Publication No. 2015/0062366;
U.S. Patent Application Publication No. 2015/0063215;
U.S. Patent Application Publication No. 2015/0063676;
U.S. Patent Application Publication No. 2015/0069130;
U.S. Patent Application Publication No. 2015/0071819;
U.S. Patent Application Publication No. 2015/0083800;
U.S. Patent Application Publication No. 2015/0086114;
U.S. Patent Application Publication No. 2015/0088522;
U.S. Patent Application Publication No. 2015/0096872;
U.S. Patent Application Publication No. 2015/0099557;

U.S. Patent Application Publication No. 2015/0100196;
U.S. Patent Application Publication No. 2015/0102109;
U.S. Patent Application Publication No. 2015/0115035;
U.S. Patent Application Publication No. 2015/0127791;
U.S. Patent Application Publication No. 2015/0128116;
U.S. Patent Application Publication No. 2015/0129659;
U.S. Patent Application Publication No. 2015/0133047;
U.S. Patent Application Publication No. 2015/0134470;
U.S. Patent Application Publication No. 2015/0136851;
U.S. Patent Application Publication No. 2015/0136854;
U.S. Patent Application Publication No. 2015/0142492;
U.S. Patent Application Publication No. 2015/0144692;
U.S. Patent Application Publication No. 2015/0144698;
U.S. Patent Application Publication No. 2015/0144701;
U.S. Patent Application Publication No. 2015/0149946;
U.S. Patent Application Publication No. 2015/0161429;
U.S. Patent Application Publication No. 2015/0169925;
U.S. Patent Application Publication No. 2015/0169929;
U.S. Patent Application Publication No. 2015/0178523;
U.S. Patent Application Publication No. 2015/0178534;
U.S. Patent Application Publication No. 2015/0178535;
U.S. Patent Application Publication No. 2015/0178536;
U.S. Patent Application Publication No. 2015/0178537;
U.S. Patent Application Publication No. 2015/0181093;
U.S. Patent Application Publication No. 2015/0181109;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/458,405 for an Electronic Device, filed Jun. 19, 2013 (Fitch et al.);
U.S. patent application Ser. No. 29/459,620 for an Electronic Device Enclosure, filed Jul. 2, 2013 (London et al.);
U.S. patent application Ser. No. 29/468,118 for an Electronic Device Case, filed Sep. 26, 2013 (Oberpriller et al.);
U.S. patent application Ser. No. 14/150,393 for Indicia-reader Having Unitary Construction Scanner, filed Jan. 8, 2014 (Colavito et al.);
U.S. patent application Ser. No. 14/200,405 for Indicia Reader for Size-Limited Applications filed Mar. 7, 2014 (Feng et al.);
U.S. patent application Ser. No. 14/231,898 for Hand-Mounted Indicia-Reading Device with Finger Motion Triggering filed Apr. 1, 2014 (Van Horn et al.);
U.S. patent application Ser. No. 29/486,759 for an Imaging Terminal, filed Apr. 2, 2014 (Oberpriller et al.);
U.S. patent application Ser. No. 14/257,364 for Docking System and Method Using Near Field Communication filed Apr. 21, 2014 (Showering);
U.S. patent application Ser. No. 14/264,173 for Autofocus Lens System for Indicia Readers filed Apr. 29, 2014 (Ackley et al.);
U.S. patent application Ser. No. 14/277,337 for MULTIPURPOSE OPTICAL READER, filed May 14, 2014 (Jovanovski et al.);
U.S. patent application Ser. No. 14/283,282 for TERMINAL HAVING ILLUMINATION AND FOCUS CONTROL filed May 21, 2014 (Liu et al.);
U.S. patent application Ser. No. 14/327,827 for a MOBILE-PHONE ADAPTER FOR ELECTRONIC TRANSACTIONS, filed Jul. 10, 2014 (Hejl);
U.S. patent application Ser. No. 14/334,934 for a SYSTEM AND METHOD FOR INDICIA VERIFICATION, filed Jul. 18, 2014 (Hejl);
U.S. patent application Ser. No. 14/339,708 for LASER SCANNING CODE SYMBOL READING SYSTEM, filed Jul. 24, 2014 (Xian et al.);
U.S. patent application Ser. No. 14/340,627 for an AXIALLY REINFORCED FLEXIBLE SCAN ELEMENT, filed Jul. 25, 2014 (Rueblinger et al.);
U.S. patent application Ser. No. 14/446,391 for MULTIFUNCTION POINT OF SALE APPARATUS WITH OPTICAL SIGNATURE CAPTURE filed Jul. 30, 2014 (Good et al.);
U.S. patent application Ser. No. 14/452,697 for INTERACTIVE INDICIA READER, filed Aug. 6, 2014 (Todeschini);
U.S. patent application Ser. No. 14/453,019 for DIMENSIONING SYSTEM WITH GUIDED ALIGNMENT, filed Aug. 6, 2014 (Li et al.);
U.S. patent application Ser. No. 14/462,801 for MOBILE COMPUTING DEVICE WITH DATA COGNITION SOFTWARE, filed on Aug. 19, 2014 (Todeschini et al.);
U.S. patent application Ser. No. 14/483,056 for VARIABLE DEPTH OF FIELD BARCODE SCANNER filed Sep. 10, 2014 (McCloskey et al.);
U.S. patent application Ser. No. 14/513,808 for IDENTIFYING INVENTORY ITEMS IN A STORAGE FACILITY filed Oct. 14, 2014 (Singel et al.);
U.S. patent application Ser. No. 14/519,195 for HAND-HELD DIMENSIONING SYSTEM WITH FEEDBACK filed Oct. 21, 2014 (Laffargue et al.);
U.S. patent application Ser. No. 14/519,179 for DIMENSIONING SYSTEM WITH MULTIPATH INTERFERENCE MITIGATION filed Oct. 21, 2014 (Thuries et al.);
U.S. patent application Ser. No. 14/519,211 for SYSTEM AND METHOD FOR DIMENSIONING filed Oct. 21, 2014 (Ackley et al.);
U.S. patent application Ser. No. 14/519,233 for HAND-HELD DIMENSIONER WITH DATA-QUALITY INDICATION filed Oct. 21, 2014 (Laffargue et al.);
U.S. patent application Ser. No. 14/519,249 for HAND-HELD DIMENSIONING SYSTEM WITH MEASUREMENT-CONFORMANCE FEEDBACK filed Oct. 21, 2014 (Ackley et al.);
U.S. patent application Ser. No. 14/527,191 for METHOD AND SYSTEM FOR RECOGNIZING SPEECH USING WILDCARDS IN AN EXPECTED RESPONSE filed Oct. 29, 2014 (Braho et al.);
U.S. patent application Ser. No. 14/529,563 for ADAPTABLE INTERFACE FOR A MOBILE COMPUTING DEVICE filed Oct. 31, 2014 (Schoon et al.);
U.S. patent application Ser. No. 14/529,857 for BARCODE READER WITH SECURITY FEATURES filed Oct. 31, 2014 (Todeschini et al.);
U.S. patent application Ser. No. 14/398,542 for PORTABLE ELECTRONIC DEVICES HAVING A SEPARATE LOCATION TRIGGER UNIT FOR USE IN CONTROLLING AN APPLICATION UNIT filed Nov. 3, 2014 (Bian et al.);
U.S. patent application Ser. No. 14/531,154 for DIRECTING AN INSPECTOR THROUGH AN INSPECTION filed Nov. 3, 2014 (Miller et al.);
U.S. patent application Ser. No. 14/533,319 for BARCODE SCANNING SYSTEM USING WEARABLE DEVICE WITH EMBEDDED CAMERA filed Nov. 5, 2014 (Todeschini);
U.S. patent application Ser. No. 14/535,764 for CONCATENATED EXPECTED RESPONSES FOR SPEECH RECOGNITION filed Nov. 7, 2014 (Braho et al.);
U.S. patent application Ser. No. 14/568,305 for AUTO-CONTRAST VIEWFINDER FOR AN INDICIA READER filed Dec. 12, 2014 (Todeschini);

U.S. patent application Ser. No. 14/573,022 for DYNAMIC DIAGNOSTIC INDICATOR GENERATION filed Dec. 17, 2014 (Goldsmith);

U.S. patent application Ser. No. 14/578,627 for SAFETY SYSTEM AND METHOD filed Dec. 22, 2014 (Ackley et al.);

U.S. patent application Ser. No. 14/580,262 for MEDIA GATE FOR THERMAL TRANSFER PRINTERS filed Dec. 23, 2014 (Bowles);

U.S. patent application Ser. No. 14/590,024 for SHELVING AND PACKAGE LOCATING SYSTEMS FOR DELIVERY VEHICLES filed Jan. 6, 2015 (Payne);

U.S. patent application Ser. No. 14/596,757 for SYSTEM AND METHOD FOR DETECTING BARCODE PRINTING ERRORS filed Jan. 14, 2015 (Ackley);

U.S. patent application Ser. No. 14/416,147 for OPTICAL READING APPARATUS HAVING VARIABLE SETTINGS filed Jan. 21, 2015 (Chen et al.);

U.S. patent application Ser. No. 14/614,706 for DEVICE FOR SUPPORTING AN ELECTRONIC TOOL ON A USER'S HAND filed Feb. 5, 2015 (Oberpriller et al.);

U.S. patent application Ser. No. 14/614,796 for CARGO APPORTIONMENT TECHNIQUES filed Feb. 5, 2015 (Morton et al.);

U.S. patent application Ser. No. 29/516,892 for TABLE COMPUTER filed Feb. 6, 2015 (Bidwell et al.);

U.S. patent application Ser. No. 14/619,093 for METHODS FOR TRAINING A SPEECH RECOGNITION SYSTEM filed Feb. 11, 2015 (Pecorari);

U.S. patent application Ser. No. 14/628,708 for DEVICE, SYSTEM, AND METHOD FOR DETERMINING THE STATUS OF CHECKOUT LANES filed Feb. 23, 2015 (Todeschini);

U.S. patent application Ser. No. 14/630,841 for TERMINAL INCLUDING IMAGING ASSEMBLY filed Feb. 25, 2015 (Gomez et al.);

U.S. patent application Ser. No. 14/635,346 for SYSTEM AND METHOD FOR RELIABLE STORE-AND-FORWARD DATA HANDLING BY ENCODED INFORMATION READING TERMINALS filed Mar. 2, 2015 (Sevier);

U.S. patent application Ser. No. 29/519,017 for SCANNER filed Mar. 2, 2015 (Zhou et al.);

U.S. patent application Ser. No. 14/405,278 for DESIGN PATTERN FOR SECURE STORE filed Mar. 9, 2015 (Zhu et al.);

U.S. patent application Ser. No. 14/660,970 for DECODABLE INDICIA READING TERMINAL WITH COMBINED ILLUMINATION filed Mar. 18, 2015 (Kearney et al.);

U.S. patent application Ser. No. 14/661,013 for REPROGRAMMING SYSTEM AND METHOD FOR DEVICES INCLUDING PROGRAMMING SYMBOL filed Mar. 18, 2015 (Soule et al.);

U.S. patent application Ser. No. 14/662,922 for MULTIFUNCTION POINT OF SALE SYSTEM filed Mar. 19, 2015 (Van Horn et al.);

U.S. patent application Ser. No. 14/663,638 for VEHICLE MOUNT COMPUTER WITH CONFIGURABLE IGNITION SWITCH BEHAVIOR filed Mar. 20, 2015 (Davis et al.);

U.S. patent application Ser. No. 14/664,063 for METHOD AND APPLICATION FOR SCANNING A BARCODE WITH A SMART DEVICE WHILE CONTINUOUSLY RUNNING AND DISPLAYING AN APPLICATION ON THE SMART DEVICE DISPLAY filed Mar. 20, 2015 (Todeschini);

U.S. patent application Ser. No. 14/669,280 for TRANSFORMING COMPONENTS OF A WEB PAGE TO VOICE PROMPTS filed Mar. 26, 2015 (Funyak et al.);

U.S. patent application Ser. No. 14/674,329 for AIMER FOR BARCODE SCANNING filed Mar. 31, 2015 (Bidwell);

U.S. patent application Ser. No. 14/676,109 for INDICIA READER filed Apr. 1, 2015 (Huck);

U.S. patent application Ser. No. 14/676,327 for DEVICE MANAGEMENT PROXY FOR SECURE DEVICES filed Apr. 1, 2015 (Yeakley et al.);

U.S. patent application Ser. No. 14/676,898 for NAVIGATION SYSTEM CONFIGURED TO INTEGRATE MOTION SENSING DEVICE INPUTS filed Apr. 2, 2015 (Showering);

U.S. patent application Ser. No. 14/679,275 for DIMENSIONING SYSTEM CALIBRATION SYSTEMS AND METHODS filed Apr. 6, 2015 (Laffargue et al.);

U.S. patent application Ser. No. 29/523,098 for HANDLE FOR A TABLET COMPUTER filed Apr. 7, 2015 (Bidwell et al.);

U.S. patent application Ser. No. 14/682,615 for SYSTEM AND METHOD FOR POWER MANAGEMENT OF MOBILE DEVICES filed Apr. 9, 2015 (Murawski et al.);

U.S. patent application Ser. No. 14/686,822 for MULTIPLE PLATFORM SUPPORT SYSTEM AND METHOD filed Apr. 15, 2015 (Qu et al.);

U.S. patent application Ser. No. 14/687,289 for SYSTEM FOR COMMUNICATION VIA A PERIPHERAL HUB filed Apr. 15, 2015 (Kohtz et al.);

U.S. patent application Ser. No. 29/524,186 for SCANNER filed Apr. 17, 2015 (Zhou et al.);

U.S. patent application Ser. No. 14/695,364 for MEDICATION MANAGEMENT SYSTEM filed Apr. 24, 2015 (Sewell et al.);

U.S. patent application Ser. No. 14/695,923 for SECURE UNATTENDED NETWORK AUTHENTICATION filed Apr. 24, 2015 (Kubler et al.);

U.S. patent application Ser. No. 29/525,068 for TABLET COMPUTER WITH REMOVABLE SCANNING DEVICE filed Apr. 27, 2015 (Schulte et al.);

U.S. patent application Ser. No. 14/699,436 for SYMBOL READING SYSTEM HAVING PREDICTIVE DIAGNOSTICS filed Apr. 29, 2015 (Nahill et al.);

U.S. patent application Ser. No. 14/702,110 for SYSTEM AND METHOD FOR REGULATING BARCODE DATA INJECTION INTO A RUNNING APPLICATION ON A SMART DEVICE filed May 1, 2015 (Todeschini et al.);

U.S. patent application Ser. No. 14/702,979 for TRACKING BATTERY CONDITIONS filed May 4, 2015 (Young et al.);

U.S. patent application Ser. No. 14/704,050 for INTERMEDIATE LINEAR POSITIONING filed May 5, 2015 (Charpentier et al.);

U.S. patent application Ser. No. 14/705,012 for HANDS-FREE HUMAN MACHINE INTERFACE RESPONSIVE TO A DRIVER OF A VEHICLE filed May 6, 2015 (Fitch et al.);

U.S. patent application Ser. No. 14/705,407 for METHOD AND SYSTEM TO PROTECT SOFTWARE-BASED NETWORK-CONNECTED DEVICES FROM ADVANCED PERSISTENT THREAT filed May 6, 2015 (Hussey et al.);

U.S. patent application Ser. No. 14/707,037 for SYSTEM AND METHOD FOR DISPLAY OF INFORMATION USING A VEHICLE-MOUNT COMPUTER filed May 8, 2015 (Chamberlin);

U.S. patent application Ser. No. 14/707,123 for APPLICATION INDEPENDENT DEX/UCS INTERFACE filed May 8, 2015 (Pape);

U.S. patent application Ser. No. 14/707,492 for METHOD AND APPARATUS FOR READING OPTICAL INDICIA USING A PLURALITY OF DATA SOURCES filed May 8, 2015 (Smith et al.);

U.S. patent application Ser. No. 14/710,666 for PRE-PAID USAGE SYSTEM FOR ENCODED INFORMATION READING TERMINALS filed May 13, 2015 (Smith);

U.S. patent application Ser. No. 29/526,918 for CHARGING BASE filed May 14, 2015 (Fitch et al.);

U.S. patent application Ser. No. 14/715,672 for AUGMENTED REALITY ENABLED HAZARD DISPLAY filed May 19, 2015 (Venkatesha et al.);

U.S. patent application Ser. No. 14/715,916 for EVALUATING IMAGE VALUES filed May 19, 2015 (Ackley);

U.S. patent application Ser. No. 14/722,608 for INTERACTIVE USER INTERFACE FOR CAPTURING A DOCUMENT IN AN IMAGE SIGNAL filed May 27, 2015 (Showering et al.);

U.S. patent application Ser. No. 29/528,165 for IN-COUNTER BARCODE SCANNER filed May 27, 2015 (Oberpriller et al.);

U.S. patent application Ser. No. 14/724,134 for ELECTRONIC DEVICE WITH WIRELESS PATH SELECTION CAPABILITY filed May 28, 2015 (Wang et al.);

U.S. patent application Ser. No. 14/724,849 for METHOD OF PROGRAMMING THE DEFAULT CABLE INTERFACE SOFTWARE IN AN INDICIA READING DEVICE filed May 29, 2015 (Barten);

U.S. patent application Ser. No. 14/724,908 for IMAGING APPARATUS HAVING IMAGING ASSEMBLY filed May 29, 2015 (Barber et al.);

U.S. patent application Ser. No. 14/725,352 for APPARATUS AND METHODS FOR MONITORING ONE OR MORE PORTABLE DATA TERMINALS (Caballero et al.);

U.S. patent application Ser. No. 29/528,590 for ELECTRONIC DEVICE filed May 29, 2015 (Fitch et al.);

U.S. patent application Ser. No. 29/528,890 for MOBILE COMPUTER HOUSING filed Jun. 2, 2015 (Fitch et al.);

U.S. patent application Ser. No. 14/728,397 for DEVICE MANAGEMENT USING VIRTUAL INTERFACES CROSS-REFERENCE TO RELATED APPLICATIONS filed Jun. 2, 2015 (Caballero);

U.S. patent application Ser. No. 14/732,870 for DATA COLLECTION MODULE AND SYSTEM filed Jun. 8, 2015 (Powilleit);

U.S. patent application Ser. No. 29/529,441 for INDICIA READING DEVICE filed Jun. 8, 2015 (Zhou et al.);

U.S. patent application Ser. No. 14/735,717 for INDICIA-READING SYSTEMS HAVING AN INTERFACE WITH A USER'S NERVOUS SYSTEM filed Jun. 10, 2015 (Todeschini);

U.S. patent application Ser. No. 14/738,038 for METHOD OF AND SYSTEM FOR DETECTING OBJECT WEIGHING INTERFERENCES filed Jun. 12, 2015 (Amundsen et al.);

U.S. patent application Ser. No. 14/740,320 for TACTILE SWITCH FOR A MOBILE ELECTRONIC DEVICE filed Jun. 16, 2015 (Bandringa);

U.S. patent application Ser. No. 14/740,373 for CALIBRATING A VOLUME DIMENSIONER filed Jun. 16, 2015 (Ackley et al.);

U.S. patent application Ser. No. 14/742,818 for INDICIA READING SYSTEM EMPLOYING DIGITAL GAIN CONTROL filed Jun. 18, 2015 (Xian et al.);

U.S. patent application Ser. No. 14/743,257 for WIRELESS MESH POINT PORTABLE DATA TERMINAL filed Jun. 18, 2015 (Wang et al.);

U.S. patent application Ser. No. 29/530,600 for CYCLONE filed Jun. 18, 2015 (Vargo et al);

U.S. patent application Ser. No. 14/744,633 for IMAGING APPARATUS COMPRISING IMAGE SENSOR ARRAY HAVING SHARED GLOBAL SHUTTER CIRCUITRY filed Jun. 19, 2015 (Wang);

U.S. patent application Ser. No. 14/744,836 for CLOUD-BASED SYSTEM FOR READING OF DECODABLE INDICIA filed Jun. 19, 2015 (Todeschini et al.);

U.S. patent application Ser. No. 14/745,006 for SELECTIVE OUTPUT OF DECODED MESSAGE DATA filed Jun. 19, 2015 (Todeschini et al.);

U.S. patent application Ser. No. 14/747,197 for OPTICAL PATTERN PROJECTOR filed Jun. 23, 2015 (Thuries et al.);

U.S. patent application Ser. No. 14/747,490 for DUAL-PROJECTOR THREE-DIMENSIONAL SCANNER filed Jun. 23, 2015 (Jovanovski et al.); and U.S. patent application Ser. No. 14/748,446 for CORDLESS INDICIA READER WITH A MULTIFUNCTION COIL FOR WIRELESS CHARGING AND EAS DEACTIVATION, filed Jun. 24, 2015 (Xie et al.).

In the specification and/or figures, typical embodiments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. A method for generating an estimated number of workflow cycles able to be executed with a remaining battery capacity of a battery in a device, wherein a workflow cycle comprises a predefined series of tasks of a work application, the method comprising:

determining, by a processor in the device, a beginning battery capacity of the battery in the device at a start of an execution of the work application;

executing, by the processor, the work application;

determining, by the processor, an end battery capacity of the battery in the device at completion of the execution of the work application, the beginning battery capacity and the end battery capacity comprising battery usage data;

calculating, by the processor a battery usage estimate associated with the work application from a difference between the beginning battery capacity and the end battery capacity;

storing, by the processor, at least one of the battery usage data and the battery usage estimate associated with the work application in a memory of the device;

determining, by the processor, the remaining battery capacity at a start of execution of the work application in another workflow cycle;

calculating, by the processor, the estimated number of workflow cycles, which are executable by the processor, based on the remaining battery capacity and the battery usage estimate; and displaying, by the processor, via an icon on a user interface of the device, the estimated number of workflow cycles that are executable by the processor with the remaining battery capacity, wherein an appearance of the icon can be configured to represent respective ranges of the estimated number of workflow cycles remaining.

2. The method according to claim 1, wherein determining the beginning battery capacity, the ending battery capacity, and the remaining battery capacity comprises determining, by the processor, from a battery monitor in the device.

3. The method according to claim 1, further comprising, prior to calculating the estimated number of workflow cycles and in response to loading of the work application on the device for another workflow cycle, retrieving, by the processor at least one of the battery usage data and the battery usage estimate from the memory of the device.

4. The method according to claim 1, wherein the icon represents respective ranges of the estimated number of workflow cycles remaining using respective colors.

5. The method according to claim 1, further comprising providing, by the processor, an alert if the estimated number of workflow cycles is less than a predetermined minimum number.

6. The method according to claim 1, further comprising providing, by the processor, instructions to recharge or replace the battery if the estimated number of workflow cycles is less than a predetermined minimum number.

7. The method according to claim 2, further comprising adjusting, by the processor, the battery usage estimate associated with the work application to account for one or more current environmental factors.

8. The method according to claim 3, further comprising:
generating, by the processor, additional battery usage data and an additional battery usage estimate from executing the work application in another workflow cycle; and
updating, by the processor, the battery usage estimate and the battery usage data from prior execution of the work application in one or more workflow cycles with the additional battery usage data and the additional battery usage estimate.

9. A system configured to generate an estimated number of workflow cycles able to be executed with a remaining battery capacity of a battery in a device, wherein a workflow cycle comprises a predefined series of tasks of a work application, the system comprising:
a processor,
a memory device coupled to the processor and having a program stored thereon for execution by the processor to:
determine a beginning battery capacity of the battery in the device at a start of an execution of the work application;
execute the work application;
determine an end battery capacity of the battery in the device at completion of the execution of the work application, the beginning battery capacity and the end battery capacity comprising battery usage data;
calculate a battery usage estimate associated with the work application from a difference between the beginning battery capacity and the end battery capacity;
store at least one of the battery usage data and the battery usage estimate associated with the work application in a memory;
determine the remaining battery capacity at a start of execution of the work application in another workflow cycle;
calculate the estimated number of workflow cycles, based on the remaining battery capacity and the battery usage estimate; and
display, via an icon on a user interface of the device the estimated number of workflow cycles that are executable by the processor with the remaining battery capacity, wherein an appearance of the icon can be configured to represent respective ranges of the estimated number of workflow cycles.

10. The system according to claim 9, wherein a battery monitor in a device is configured to determine the beginning battery capacity, the end battery capacity, and the remaining battery capacity.

11. The system according to claim 9, wherein the processor is further configured to retrieve at least one of the battery usage data and the battery usage estimate from the memory of the device prior to calculating the estimated number of workflow cycles and in response to loading of the work application on the device for another workflow cycle.

12. The system according to claim 9, wherein the icon represents respective ranges of the estimated number of workflow cycles remaining using respective colors.

13. The system according to claim 9, wherein the processor is configured to provide an alert if the estimated number of workflow cycles is less than a predetermined minimum number.

14. The system according to claim 9, wherein the processor is configured to provide instructions to recharge or replace the battery if the estimated number of workflow cycles is less than a predetermined minimum number.

15. The system according to claim 11, wherein the processor is configured to:
generate additional battery usage data and an additional battery usage estimate from executing the work application in another workflow cycle; and
update the battery usage estimate and the battery usage data from prior execution of the work application in one or more workflow cycles with the additional battery usage data and the additional battery usage estimate.

16. The system according to claim 10, wherein the processor is configured to adjust the battery usage estimate associated with the work application to account for one or more current environmental factors.

17. A non-transitory machine-readable storage device having instructions for execution by a processor of a machine to perform a method for generating an estimated number of workflow cycles able to be executed with a remaining battery capacity of a battery in a device, wherein a workflow cycle comprises a predefined series of tasks of a work application, the method comprising the steps of:
determining a beginning battery capacity of the battery in the device at a start of an execution of the work application;
executing a work application;
determining an end battery capacity of the battery in the device at completion of the execution of the work application, the beginning battery capacity and the end battery capacity comprising battery usage data;
calculating a battery usage estimate associated with the work application from a difference between the beginning battery capacity and the end battery capacity;

storing at least one of the battery usage data and the battery usage estimate associated with the work application in a memory of the device;

determining the remaining battery capacity at a start of execution of the work application in another workflow cycle;

calculating the estimated number of workflow cycles, which are executable by the processor, based on the remaining battery capacity and the battery usage estimate; and displaying, via an icon on a user interface of the device the estimated number of workflow cycles that are executable by the processor with the remaining battery capacity, wherein an appearance of the icon can be configured to represent respective ranges of the estimated number of workflow cycles remaining.

18. The machine-readable storage device of claim 17, wherein determining the beginning battery capacity, the ending battery capacity, and the remaining battery capacity comprises determining, by the processor, from a battery monitor in the device.

19. The machine-readable storage device of claim 17, further comprising, prior to calculating the estimated number of workflow cycles and in response to loading of the work application on the device for another workflow cycle, retrieving, by the processor at least one of the battery usage data and the battery usage estimate from the memory of the device.

20. The machine-readable storage device of claim 19, further comprising:

generating, by the processor, additional battery usage data and an additional battery usage estimate from executing the work application in another workflow cycle; and updating, by the processor, the battery usage estimate and the battery usage data from prior execution of the work application in one or more workflow cycles with the additional battery usage data and the additional battery usage estimate.

* * * * *